(12) United States Patent
Watanabe et al.

(10) Patent No.: US 8,937,007 B2
(45) Date of Patent: Jan. 20, 2015

(54) SEMICONDUCTOR DEVICE

(75) Inventors: Kenichi Watanabe, Kawasaki (JP);
Nobuhiro Misawa, Kawasaki (JP);
Satoshi Otsuka, Kawasaki (JP)

(73) Assignee: Fujitsu Semiconductor Limited,
Yokohama (JP)

( * ) Notice: Subject to any disclaimer, the term of this patent is extended or adjusted under 35 U.S.C. 154(b) by 0 days.

(21) Appl. No.: 13/398,254

(22) Filed: Feb. 16, 2012

(65) Prior Publication Data

US 2012/0149190 A1 Jun. 14, 2012

Related U.S. Application Data

(60) Division of application No. 13/075,463, filed on Mar. 30, 2011, now Pat. No. 8,143,153, which is a division of application No. 12/564,989, filed on Sep. 23, 2009, now Pat. No. 7,939,913, which is a continuation of application No. PCT/JP2007/057156, filed on Mar. 30, 2007.

(51) Int. Cl.
*H01L 21/44* (2006.01)
*H01L 21/4763* (2006.01)
(Continued)

(52) U.S. Cl.
CPC .......... *H01L 23/562* (2013.01); *H01L 23/3192* (2013.01); *H01L 23/564* (2013.01); *H01L 24/05* (2013.01); *H01L 2924/12044* (2013.01); *H01L 2224/05567* (2013.01)
USPC ............ 438/597; 438/637; 438/638; 438/700

(58) Field of Classification Search
CPC .............. H01L 23/562; H01L 23/3192; H01L 2924/12044
USPC ................... 438/597, 637, 638, 700
See application file for complete search history.

(56) References Cited

U.S. PATENT DOCUMENTS 6,355,545 B1 3/2002 Ohba
6,498,089 B2 * 12/2002 Komada .................. 438/618
(Continued)

FOREIGN PATENT DOCUMENTS

JP 05-335300 A 12/1993
JP 9-45766 A 2/1997
(Continued)

OTHER PUBLICATIONS

International Search Report for PCT/JP2007/057156, mailing date of Jun. 26, 2007.
(Continued)

*Primary Examiner* — Luan C Thai
(74) *Attorney, Agent, or Firm* — Westerman, Hattori, Daniels & Adrian, LLP

(57) ABSTRACT

A method of manufacturing a semiconductor device, including: forming a moisture resistant ring surrounding a multilayer interconnection structure in a layered body formed of stacked layers of a plurality of interlayer insulating films lower in dielectric constant than a $SiO_2$ film and including the multilayer interconnection structure; forming a groove in the layered body between the moisture resistant ring and a scribe line, the groove reaching a surface of a semiconductor substrate; forming a film including Si and C as principal components and covering sidewall surfaces and a bottom surface of the groove; and forming a protection film on the film along the sidewall surfaces and the bottom surface of the groove.

16 Claims, 23 Drawing Sheets

(51) Int. Cl.
 *H01L 21/311* (2006.01)
 *H01L 23/00* (2006.01)
 *H01L 23/31* (2006.01)

(56) References Cited

U.S. PATENT DOCUMENTS

| | | | |
|---|---|---|---|
| 6,670,710 | B2 | 12/2003 | Matsunaga |
| 6,753,608 | B2 | 6/2004 | Tomita |
| 6,903,442 | B2 | 6/2005 | Wood et al. |
| 7,119,439 | B2* | 10/2006 | Watanabe et al. ............ 257/751 |
| 7,223,673 | B2 | 5/2007 | Wang et al. |
| 7,224,060 | B2 | 5/2007 | Zhang et al. |
| 7,235,864 | B2 | 6/2007 | Lee |
| 7,335,577 | B2* | 2/2008 | Daubenspeck et al. ....... 438/462 |
| 7,521,336 | B2 | 4/2009 | Daubenspeck et al. |
| 7,550,850 | B2 | 6/2009 | Nakashiba |
| 7,675,175 | B2* | 3/2010 | Tokitoh et al. ................ 257/758 |
| RE41,948 | E | 11/2010 | Matsunaga |
| 2002/0125577 | A1* | 9/2002 | Komada ........................ 257/774 |
| 2003/0173675 | A1* | 9/2003 | Watanabe et al. ............ 257/758 |
| 2004/0087078 | A1* | 5/2004 | Agarwala et al. ............ 438/200 |
| 2005/0026397 | A1 | 2/2005 | Daubenspeck et al. |
| 2005/0093169 | A1 | 5/2005 | Kajita |
| 2005/0116333 | A1* | 6/2005 | Akiyama ....................... 257/698 |
| 2005/0127495 | A1 | 6/2005 | Zhang et al. |
| 2005/0148202 | A1 | 7/2005 | Heiliger et al. |
| 2005/0167824 | A1 | 8/2005 | Zhang et al. |
| 2006/0012012 | A1 | 1/2006 | Wang et al. |
| 2006/0068567 | A1 | 3/2006 | Beyne et al. |
| 2006/0079072 | A1 | 4/2006 | David et al. |
| 2007/0001307 | A1 | 1/2007 | Usui et al. |

FOREIGN PATENT DOCUMENTS

| | | |
|---|---|---|
| JP | 2000-216249 A | 8/2000 |
| JP | 2000-349149 A | 12/2000 |
| JP | 2002-270608 A | 9/2002 |
| JP | 2002-353307 A | 12/2002 |
| JP | 2003-273043 A | 9/2003 |
| JP | 2004-047575 A | 2/2004 |
| JP | 2004-079596 A | 3/2004 |
| JP | 2004-119468 A | 4/2004 |
| JP | 2004-134450 A | 4/2004 |
| JP | 2004-296904 A | 10/2004 |
| JP | 2005-142262 A | 6/2005 |
| JP | 2005-217411 A | 8/2005 |
| JP | 2005-260059 A | 9/2005 |
| JP | 2006-114723 A | 4/2006 |
| JP | 2007-012996 A | 1/2007 |
| JP | 2007-500944 A | 1/2007 |

OTHER PUBLICATIONS

Taiwanese Office Action dated Jun. 30, 2010, issued in corresponding Taiwanese Patent Application No. 96111320.
Japanese Office Action dated Sep. 11, 2012, issued in corresponding Japanese Patent Application No. 2009-508816, with English translation (5 pages).
Japanese Office Action dated May 21, 2013, issued in corresponding Japanese Patent Application No. 2009-508816, with English Translation (7 pages).
Japanese Office Action dated Jan. 28, 2014, issued in Japanese Patent Application No. 2012-247939, w/English translation, (4 pages).
Japanese Office Action dated Jan. 28, 2014, issued in Japanese Patent Application No. 2012-247938, w/English translation (3 pages).

* cited by examiner

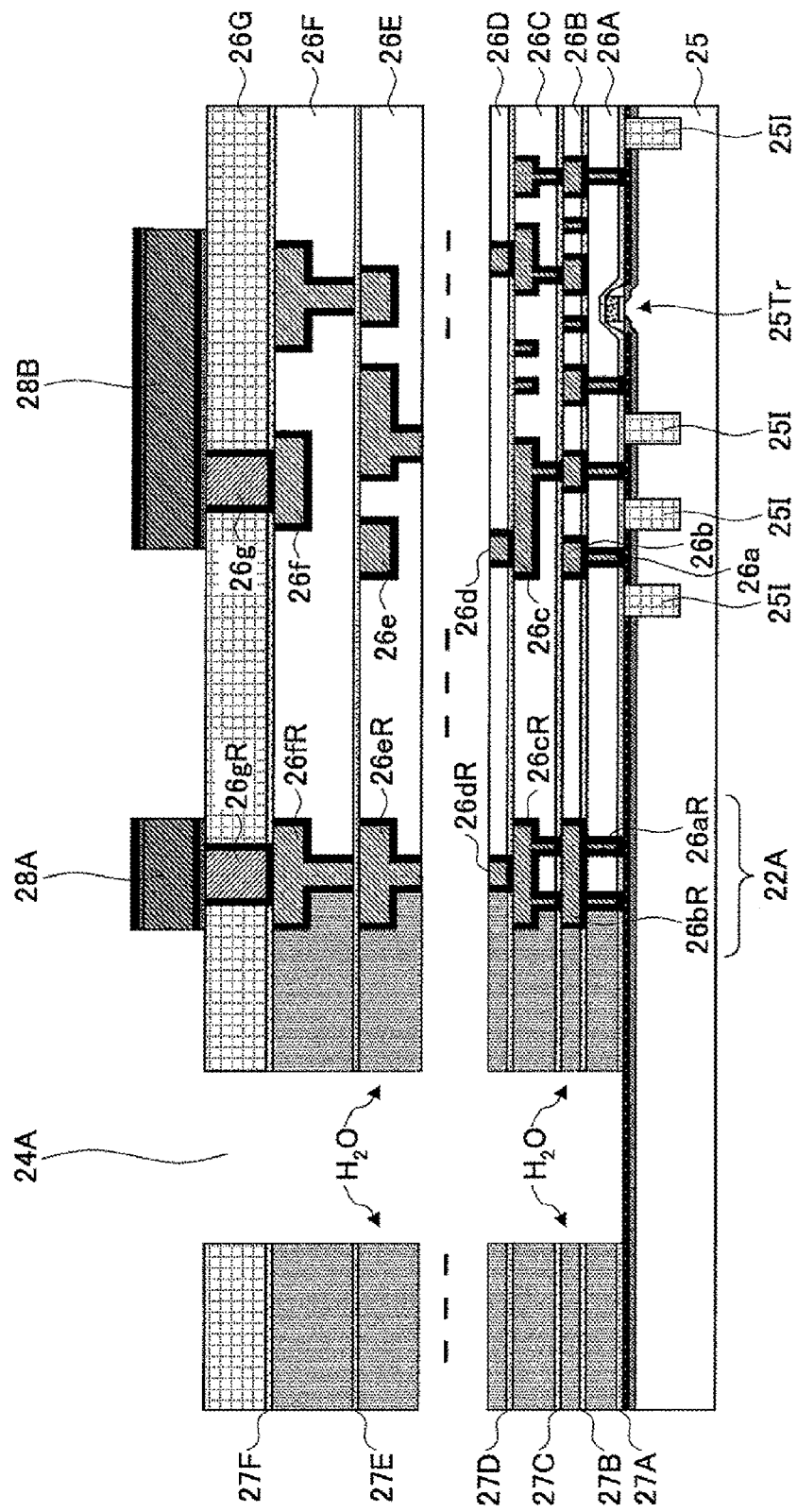

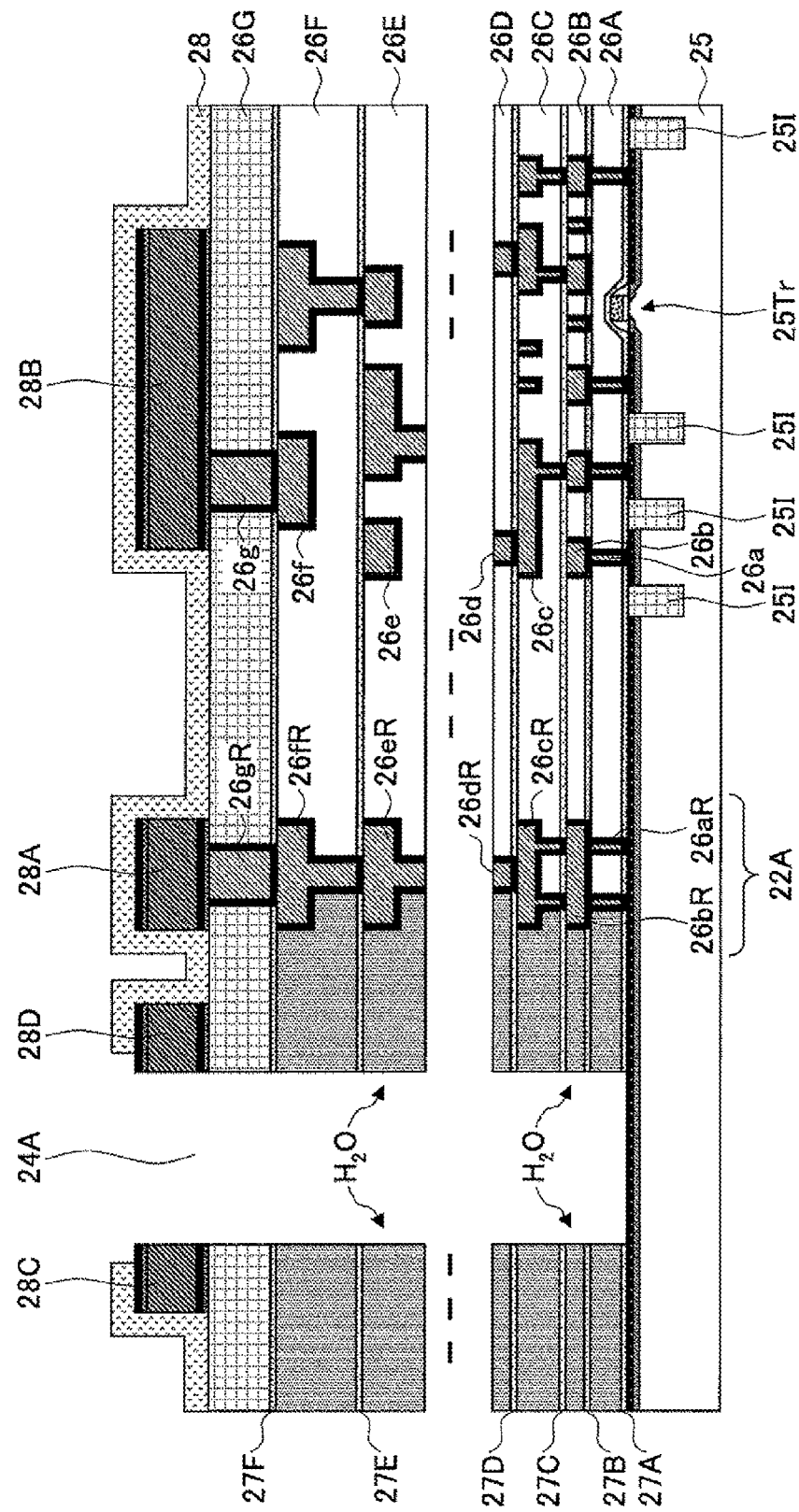

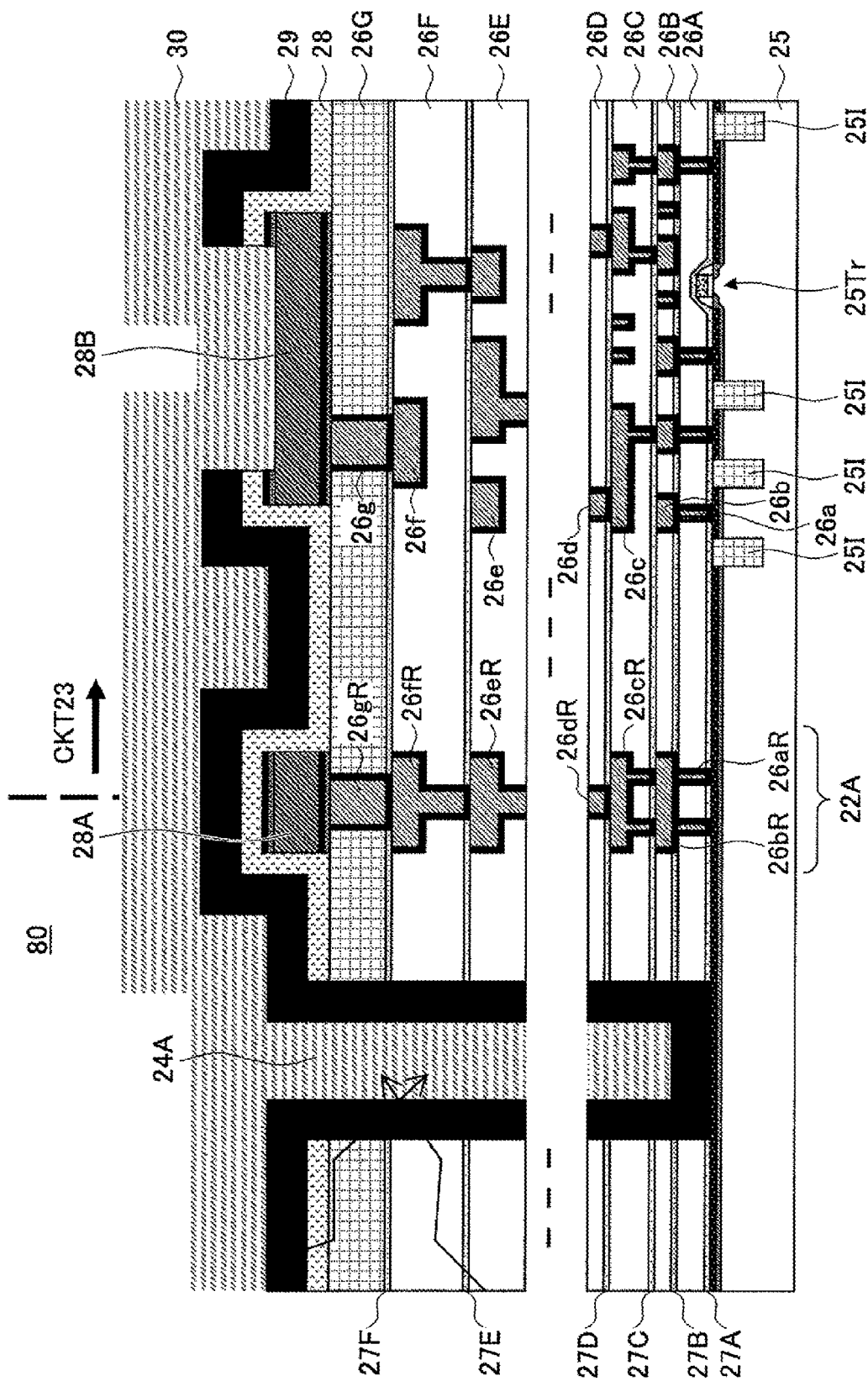

SEMICONDUCTOR DEVICE

CROSS-REFERENCE TO RELATED APPLICATIONS

This Application is a Continuation of application Ser. No. 13/075,463 filed Mar. 30, 2011, which is a Divisional of application Ser. No. 12/564,989 filed on Sep. 23, 2009, now U.S. Pat. No. 7,939,913, issued May 10, 2011, which is a Continuation of Application PCT/JP2007/057156 filed on Mar. 30, 2007.

FIELD

A certain aspect of the embodiments discussed herein is related to a semiconductor device.

BACKGROUND

According to common semiconductor device manufacturing techniques, multiple semiconductor elements are formed into a matrix on a semiconductor substrate such as a silicon wafer, and the semiconductor substrate is cut along scribe lines, so that semiconductor chips having respective individual semiconductor elements formed therein are obtained as semiconductor devices.

In such semiconductor devices (chips), semiconductor layers, insulating layers, and metal layers are exposed at their sections. Therefore, it is common to form a moisture resistant ring having the same layer structure as that of a multilayer interconnection structure in the semiconductor devices in the vicinity of the sections in order to prevent atmospheric moisture from entering the semiconductor devices through the sections.

FIG. 1 is a plan view of part of a semiconductor device formed on a semiconductor substrate according to the related art of the present invention. FIG. 2 is a cross-sectional view of part of the semiconductor device including a moisture resistant ring.

Referring to FIG. 1, device regions 11A, 11B, 11C, and 11D are separated by scribe lines indicated by single-dot chain lines on a semiconductor substrate. The device regions 11A, 11B, 11C, and 11D include circuit regions forming their respective semiconductor devices inside moisture resistant rings 12A, 12B, 12C, and 12D, respectively. In the case illustrated in FIG. 1, a circuit region (CKT) 13 is formed in the device region 11A. A similar circuit region is also formed in each of the other device regions 11B through 11D.

Further, according to the configuration of FIG. 1, protection groove parts 14A through 14D are formed in the device regions 11A through 11D, respectively, outside the corresponding moisture resistant rings 12A through 12D and inside the scribe lines indicated by single-dot chain lines, in order to block propagation of cracks at the time of scribing.

The individual semiconductor devices are separated in the form of semiconductor chips by cutting the silicon substrate along the scribe lines indicated by single-dot chain lines in the plan view of FIG. 1.

FIG. 2 is a cross-sectional view of a semiconductor device 10 thus obtained.

Referring to FIG. 2, the semiconductor device 10 is formed on a silicon substrate 15 where isolation regions 15I and a transistor 15Tr are formed. The transistor 15Tr is covered with a SiN film 17A. A multilayer interconnection structure of alternate layers of interlayer insulating films 16A, 16B, 16C, 16D, 16E, 16F, and 16G each formed of a silicon oxide film and silicon nitride films 17B, 17C, 17D, 17E, and 17F is formed on the SiN film 17A covering the transistor 15Tr on the silicon substrate 15.

In the case illustrated in FIG. 2, in the interlayer insulating film 16A, via patters 16aR of a material such as W are continuously formed in contact with the surface of the silicon substrate 15 in correspondence to the moisture resistant ring 12A, and via plugs 16a of a material such as W are formed in contact with silicide layers 15c and 15d covering diffusion regions 15a and 15b, respectively, of the transistor 15Tr in the circuit region 13.

Further, in the interlayer insulating film 16B, a Cu pattern 16bR is continuously formed in contact with the via patterns 16aR by a single damascene process in correspondence to the moisture resistant ring 12A, and Cu interconnection patterns 16b are formed in contact with the via plugs 16a also by a single damascene process in the circuit region 13.

Further, in the interlayer insulating film 16C, a Cu pattern 16cR is continuously formed in contact with the Cu pattern 16bR below by a single or dual damascene process in correspondence to the moisture resistant ring 12A, and Cu interconnection patterns 16c having via plugs are formed in contact with the Cu interconnection patterns 16b also by a single or dual damascene process in the circuit region 13.

Further, in the interlayer insulating film 16D, a Cu pattern 16dR is continuously formed in contact with the Cu pattern 16cR below by a single or dual damascene process in correspondence to the moisture resistant ring 12A, and Cu interconnection patterns 16d having via plugs are formed in contact with the Cu interconnection patterns 16c also by a single or dual damascene process in the circuit region 13.

Further, in the interlayer insulating film 16E, a Cu pattern 16eR is continuously formed in contact with a Cu pattern below (not graphically illustrated) by a dual damascene process in correspondence to the moisture resistant ring 12A, and Cu interconnection patterns 16e having via plugs are formed in contact with Cu interconnection patterns (not graphically illustrated) also by a dual damascene process in the circuit region 13.

Further, in the interlayer insulating film 16F, a Cu pattern 16fR is continuously formed in contact with the Cu pattern 16eR below by a dual damascene process in correspondence to the moisture resistant ring 12A, and Cu interconnection patterns 16f having via plugs are formed in contact with the Cu interconnection patterns 16e also by a dual damascene process in the circuit region 13.

Further, in the interlayer insulating film 16G, a W pattern 16gR is continuously formed in contact with the Cu pattern 16fR below by a damascene process in correspondence to the moisture resistant ring 12A, and a Cu via plug 16g is formed in contact with the corresponding Cu interconnection pattern 16f also by a damascene process in the circuit region 13.

Here, the Cu interconnection patterns 16b through 16f and the Cu patterns 16bR through 16fR are covered with a barrier metal film of Ta or the like, and the W via plugs 16a and 16g and the W patterns 16aR and 16gR are covered with a barrier film of TiN or the like.

Further, on the interlayer insulating film 16G, an Al pattern 18A sandwiched between adhesion films of a Ti/TiN structure is formed in contact with the W pattern 16gR in correspondence to the moisture resistant ring 12A, and a pad electrode 18B having a similar structure is formed on and in contact with the via plug 16g.

Further, the Al pattern 18A and the pad electrode 18B are covered with a silicon oxide film 18 deposited by high-density plasma CVD on the interlayer insulating film 16G. Further, a passivation film 19 of a SiN film is formed on the silicon oxide film 18. An opening 19A is formed in the passivation film 19 and the silicon oxide film 18 so as to expose the pad electrode 18B.

According to the configuration of FIG. 2, scribing is performed with a dicing saw at the left side end in FIG. 2 as indicated by an arrow. The protection groove 14A illustrated above with reference to FIG. 1 is formed outside the moisture resistant ring 12A in order to block propagation of cracks at the time of scribing.

On the other hand, according to the semiconductor device 10 of the configuration of FIG. 2, its left side end in FIG. 2 is exposed to the atmosphere. Therefore, as illustrated in FIG. 3, moisture ($H_2O$) enters the portions of the interlayer insulating films 16A through 16F outside the moisture resistant ring 12A, but the moisture resistant ring 12A prevents this moisture from entering the circuit region 13. Accordingly, there is a problem in that the moisture resistant ring 12A, on which a heavy workload is imposed, is susceptible to corrosion. If there is a defect in part of the moisture resistant ring 12A, moisture enters the semiconductor device 10 through the part. In FIG. 3, such a defect is in the Cu pattern 16cR of the moisture resistant ring 12A circled with a broken line.

This problem of the workload on the moisture resistant ring 12A is conspicuous particularly in the case of using low dielectric constant films of low density, or so-called Low-K films, as the interlayer insulating films 16A through 16F.

FIG. 4 is a diagram illustrating a semiconductor device that reduces such a workload on a moisture resistant ring according to the related art of the present invention. In FIG. 4, the same elements as those described above are referred to by the same reference numerals, and a description thereof is omitted.

Referring to FIG. 4, the protection groove part 14A is formed so deep as to reach the surface of the silicon substrate 15, and the SiN passivation film 19 is formed to continuously cover the surface of the protection groove part 14A.

As a result, the interlayer insulating films 16A through 16F and the interlayer insulating film 16G have their respective ends continuously covered with the SiN passivation film 19, so as to reduce a substantial workload on the moisture resistant ring 12A.

The following are examples of the related art of the present invention: Japanese Laid-open Patent Publication No. 2004-47575, Japanese Laid-open Patent Publication No. 2004-134450, Japanese Laid-open Patent Publication No. 2004-79596, Japanese Laid-open Patent Publication No. 2003-273043, Japanese Laid-open Patent Publication No. 2004-119468, Japanese Laid-open Patent Publication No. 2005-217411, Japanese Laid-open Patent Publication No. 2005-260059, Japanese Laid-open Patent Publication No. 2004-296904, and Japanese Laid-open Patent Publication No. 2006-114723.

SUMMARY

According to an aspect of the present invention, a semiconductor device includes a substrate; a layered body formed on the substrate and including a multilayer interconnection structure, the layered body including a plurality of interlayer insulating films stacked in layers, the interlayer insulating films being lower in dielectric constant than a $SiO_2$ film; a moisture resistant ring extending continuously in the layered body so as to surround a device region where an active element is formed; a protection groove part formed continuously along and outside the moisture resistant ring in the layered body so as to expose a surface of the substrate; a protection film continuously covering an upper surface of the layered body except for an electrode pad on the multilayer interconnection structure, and sidewall surfaces and a bottom surface of the protection groove part; and an interface film including Si and C as principal components and formed between the protection film and the sidewall surfaces of the protection groove part.

According to another aspect of the present invention, a semiconductor device includes a substrate; a layered body formed on the substrate and including a multilayer interconnection structure; a moisture resistant ring extending continuously in the layered body so as to surround a device region where an active element is formed; a protection groove part formed continuously along and outside the moisture resistant ring in the layered body so as to expose a surface of the substrate; and a first metal mask pattern and a second metal mask pattern extending along an outer-side edge and an inner-side edge, respectively, of the protection groove part on an upper surface of the layered body.

According to yet another aspect of the present invention, a semiconductor device includes a substrate; a layered body formed on the substrate and including a multilayer interconnection structure; a moisture resistant ring extending continuously in the layered body so as to surround a device region where an active element is formed; a protection groove part formed continuously along and outside the moisture resistant ring in the layered body so as to expose a surface of the substrate; and a protection film covering an upper surface of the layered body except for an electrode pad on the multilayer interconnection structure and covering an inner-edge-side sidewall surface of the protection groove part continuously from the upper surface of the layered body on an internal side of the protection groove part, the protection film being partially removed in a region on and outside an outer-edge-side sidewall surface of the protection groove part.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWING(S)

FIGS. 6A through 6F are diagrams illustrating a process for manufacturing the semiconductor device of FIG. 5 according to the first embodiment;

FIGS. 8A through 8C are diagrams illustrating a process for manufacturing a semiconductor device according to a second embodiment;

FIG. 16 is a cross-sectional view of a semiconductor device according to a fifth embodiment of the present invention.

DESCRIPTION OF EMBODIMENTS

As described above, according to the configuration of FIG. 4, a substantial workload on the moisture resistant ring 12A may be reduced, so that the reliability of the semiconductor device may be expected to increase.

Figure 4:
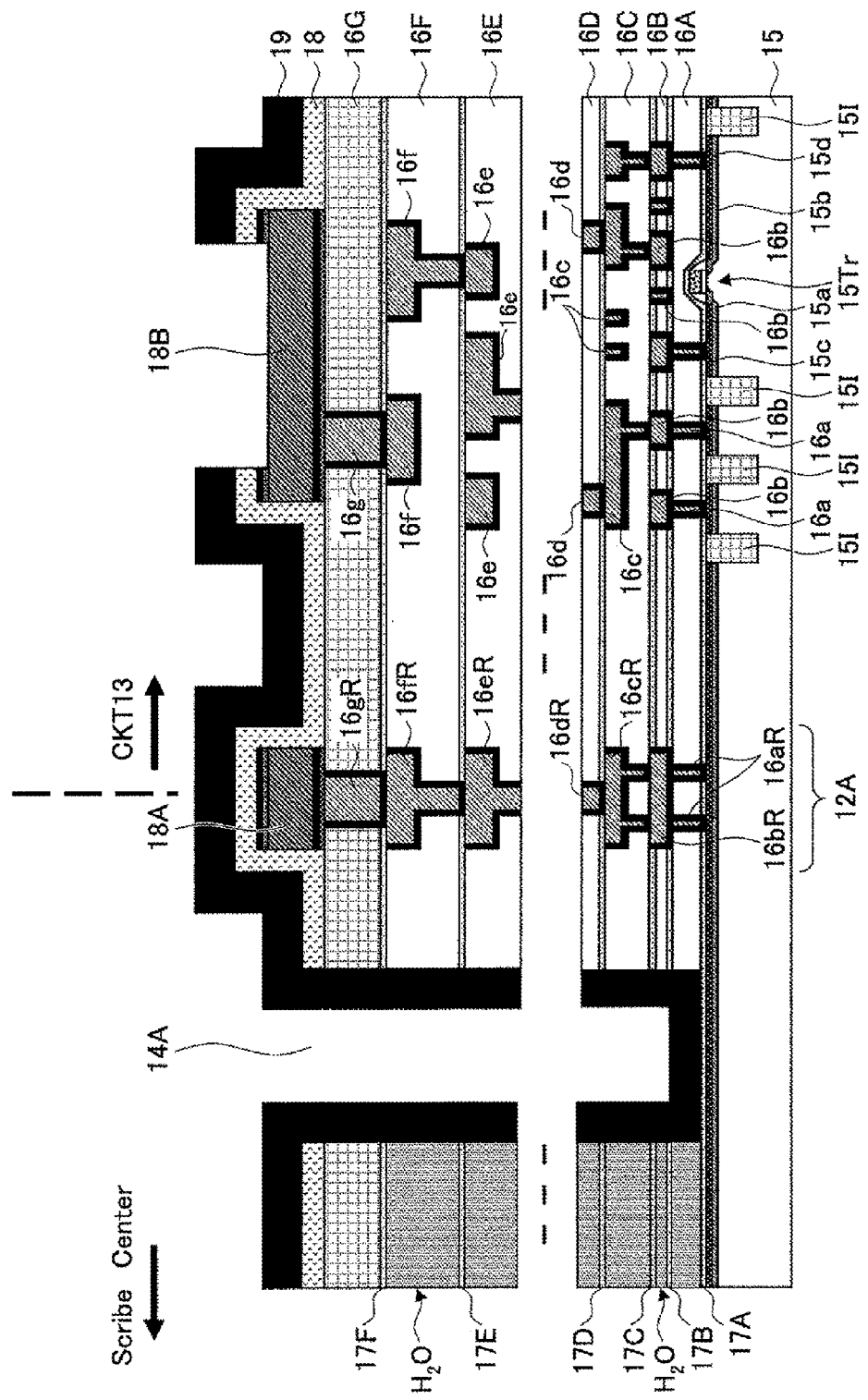
FIG. 4 is a cross-sectional view of part of another semiconductor device according to the related art.

However, forming the structure of FIG. 4 is accompanied by formation of the deep groove 14A in the layered body formed of the interlayer insulating films 16A through 16G, which may cause a problem in patterning accuracy particularly in the case of performing patterning using a resist pattern as a mask.

Further, the SiN passivation film 19, which is a film storing stress, has the problem of being likely to be reduced in adhesion and removed particularly if the interlayer insulating films 16A through 16F are low dielectric constant films.

This SiN passivation film 19 may be formed by depositing a silicon oxide film by high-density plasma CVD. In particular, however, if the interlayer insulating films 16A through 16F are organic low dielectric constant films or low dielectric constant films including many organic groups, the interlayer insulating films 16A through 16F may be eroded by an oxygen atmosphere at the time of film deposition. Therefore, it is considered difficult to apply such a technique.

Further, according to the configuration of FIG. 4, if the passivation film 19 is formed of a SiN film storing stress, a fracture at the time of scribing may reach the circuit region 13 inside the moisture resistant ring 12A through the passivation film 19 so as to reduce the reliability of the semiconductor device.

Preferred embodiments of the present invention are explained below with reference to accompanying drawings.

[a] First Embodiment

Figure 5:
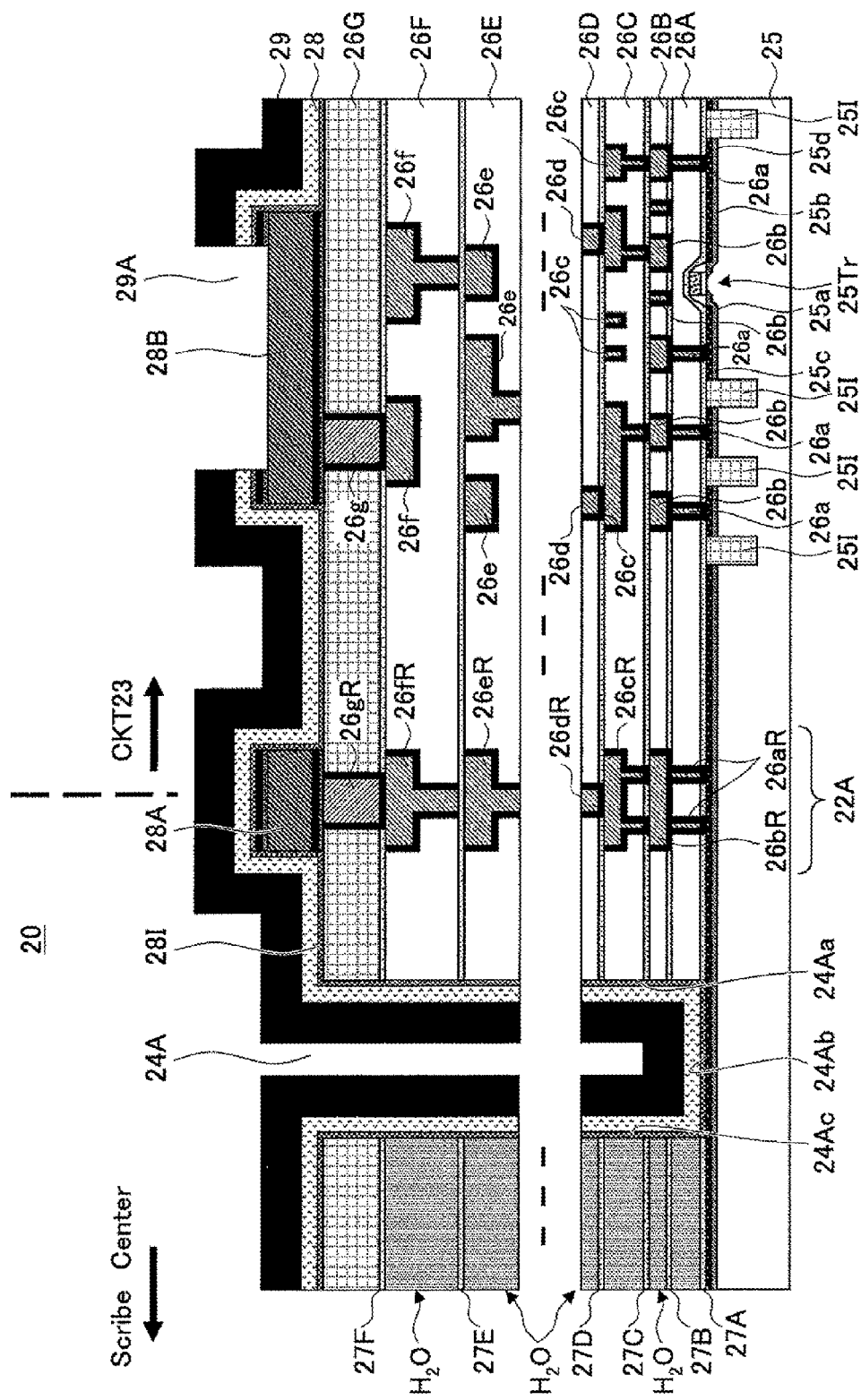
FIG. 5 is a cross-sectional view of a semiconductor device according to a first embodiment.

FIG. 5 illustrates a semiconductor device 20 according to a first embodiment of the present invention.

Referring to FIG. 5, the semiconductor device 20 is formed on a silicon substrate 25 where isolation regions 251 and a transistor 25Tr are formed. The transistor 25Tr is covered with a SiN film 27A. A layered body including a multilayer interconnection structure of alternate layers of interlayer insulating films 26A, 26B, 26C, 26D, 26E, 26F, and 26G and etching stopper films 27B, 27C, 27D, 27E, and 27F of SiN or SiC is formed on the SiN film 27A covering the transistor 25Tr on the silicon substrate 25.

In the case illustrated in FIG. 5, in the interlayer insulating film 26A, via patters 26aR of a material such as W are continuously formed in contact with the surface of the silicon substrate 25 in correspondence to a moisture resistant ring 22A, and via plugs 26a of a material such as W are formed in contact with silicide layers 25c and 25d covering diffusion regions 25a and 25b, respectively, of the transistor 25Tr in a circuit region 23 surrounded by the moisture resistant ring 22A.

Further, in the interlayer insulating film 26B, a Cu pattern 26bR is continuously formed in contact with the via patterns 26aR by a single damascene process in correspondence to the moisture resistant ring 22A, and Cu interconnection patterns 26b are formed in contact with the via plugs 26a also by a single damascene process in the circuit region 23.

Further, in the interlayer insulating film 26C, a Cu pattern 26cR is continuously formed in contact with the Cu pattern 26bR below by a dual damascene process in correspondence to the moisture resistant ring 22A, and Cu interconnection patterns 26c having via plugs are formed in contact with the Cu interconnection patterns 26b by a single or dual damascene process in the circuit region 23.

Further, in the interlayer insulating film 26D, a Cu pattern 26dR is continuously formed in contact with the Cu pattern 26cR below by a single or dual damascene process in correspondence to the moisture resistant ring 22A, and Cu interconnection patterns 26d having via plugs are formed in contact with the Cu interconnection patterns 26c by a dual damascene process in the circuit region 23.

Further, in the interlayer insulating film 26E, a Cu pattern 26eR is continuously formed in contact with a Cu pattern below (not graphically illustrated) by a dual damascene process in correspondence to the moisture resistant ring 22A, and Cu interconnection patterns 26e having via plugs are formed in contact with Cu interconnection patterns (not graphically illustrated) also by a dual damascene process in the circuit region 23.

Further, in the interlayer insulating film 26F, a Cu pattern 26fR is continuously formed in contact with the Cu pattern 26eR below by a dual damascene process in correspondence to the moisture resistant ring 22A, and Cu interconnection patterns 26f having via plugs are formed in contact with the Cu interconnection patterns 26e also by a dual damascene process in the circuit region 23.

Further, in the interlayer insulating film 26G, a W pattern 26gR is continuously formed in contact with the Cu pattern 26fR below by a damascene process in correspondence to the moisture resistant ring 22A, and a Cu via plug 26g is formed in contact with the corresponding Cu interconnection pattern 26f also by a damascene process in the circuit region 23.

Here, the Cu interconnection patterns 26b through 26f and the Cu patterns 26bR through 26fR are covered with a barrier metal film such as a Ta film or a Ta/TaN layered film, and the W via plugs 26a and 26g and the W patterns 26aR and 26gR are covered with a barrier film of TiN or the like.

Further, on the interlayer insulating film 26G, an Al pattern 28A sandwiched between adhesion films of a Ti/TiN structure is formed in contact with the W pattern 26gR in correspondence to the moisture resistant ring 22A, and a pad electrode 28B having a similar structure is formed on and in contact with the via plug 26G. In the case illustrated in FIG. 5, the interlayer insulating film 26G is formed of a silicon oxide film.

Further, the Al pattern 28A and the pad electrode 28B are covered with a silicon oxide film 28 deposited by high-density plasma CVD on the interlayer insulating film 26G. Further, a passivation film 29 of a SiN film is formed on the silicon oxide film 28 by, for example, plasma CVD. An opening 29A is formed in the passivation film 29 and the silicon oxide film 28 so as to expose the pad electrode 28B.

As the interlayer insulating films 26A through 26F, hydrocarbon insulating films commercially available under the name of Flare or SiLK (registered trademark), organic or inorganic siloxane films, and their porous films may be used. The interlayer insulating films 26A through 26F may be formed by plasma CVD or coating. The interlayer insulating films 26A through 26D are formed to be, for example, approximately 200 nm to 400 nm in thickness, and the interlayer insulating films 26E and 26F are formed to be, for example, approximately 400 nm to 600 nm in thickness.

In this embodiment, a protection groove part 24A that reaches the surface of the silicon substrate 25 is formed continuously along and outside the moisture resistant ring 22A in the layered body in the same manner as the protection groove part 14A of FIG. 4. The silicon oxide film 28 and the passivation film 29 continuously cover an inner-side (inner-edge-side) sidewall surface 24Aa, a bottom surface 24Ab, and an outer-side (outer-edge-side) sidewall surface 24Ac of the protection groove part 24A.

The protection groove part 24A is formed by performing dry etching on a layered body of the interlayer insulating films 26A through 26G stacked in layers until the surface of the silicon substrate 25 is exposed using a resist pattern as a mask.

Further, according to this embodiment, a SiC interface film 28I of 5 nm to 200 nm in thickness is formed by plasma CVD between the silicon oxide film 28 and the inner-side sidewall surface 24Aa, the bottom surface 24Ab, and the outer-side sidewall surface 24Ac of the protection groove part 24A.

Formation of this interface film 28I prevents damage to the low dielectric constant interlayer insulating films 26A through 26F exposed at the inner-side sidewall surface 24Aa or outer-side sidewall surface 24Ac of the protection groove part 24A at the time of forming the silicon oxide film 28 over the inner-side sidewall surface 24Aa, the bottom surface 24Ab, and the outer-side sidewall surface 24Ac of the protection groove part 24A.

The interface film 28I is not limited in composition to SiC, and may be replaced with films whose principal components are Si and C, such as a SiCH film, a SiOC film, and SiOCH film, as long as these films prevent damage to the low dielectric constant interlayer insulating films 26A through 26F at the time of forming the silicon oxide film 28.

In the case of forming the interface film 28I of a SiC film, the interface film 28I may be formed by, for example, plasma CVD where tetramethylsilane is fed as a material and plasma-excited at a substrate temperature of 350° C. to 400° C.

Thus, according to this embodiment, the surfaces, that is, the inner-side sidewall surface 24Aa, the bottom surface 24Ab, and the outer-side sidewall surface 24Ac, of the protection groove part 24A are covered continuously with the interface film 28I before forming the silicon oxide film 28 on the surfaces of the protection groove part 24A by high-density plasma CVD. This prevents the surfaces of the protection groove part 24A from being damaged by oxygen radicals and ions at the time of forming the silicon oxide film 28. Since the interface film 28I is formed under an oxygen-poor condition, no substantial damage is caused to the exposed end surfaces of the interlayer insulating films 26A through 26F in the protection groove part 24A.

Further, forming the silicon oxide film 28 under the SiN passivation film 29 makes it possible to prevent separation of the SiN passivation film 29, which is prone to store stress.

In the case illustrated in FIG. 5, the left end in FIG. 5 is scribed, so that the (left) end surface is exposed to the atmosphere. A large part of atmospheric moisture, however, is blocked by the SiN passivation film 29 in the protection groove part 24A, so that a workload on the moisture resistant ring 22A is significantly reduced.

A description is given below, with reference to FIGS. 6A through 6G, of a process for manufacturing the semiconductor device 20.

Figure 6A:
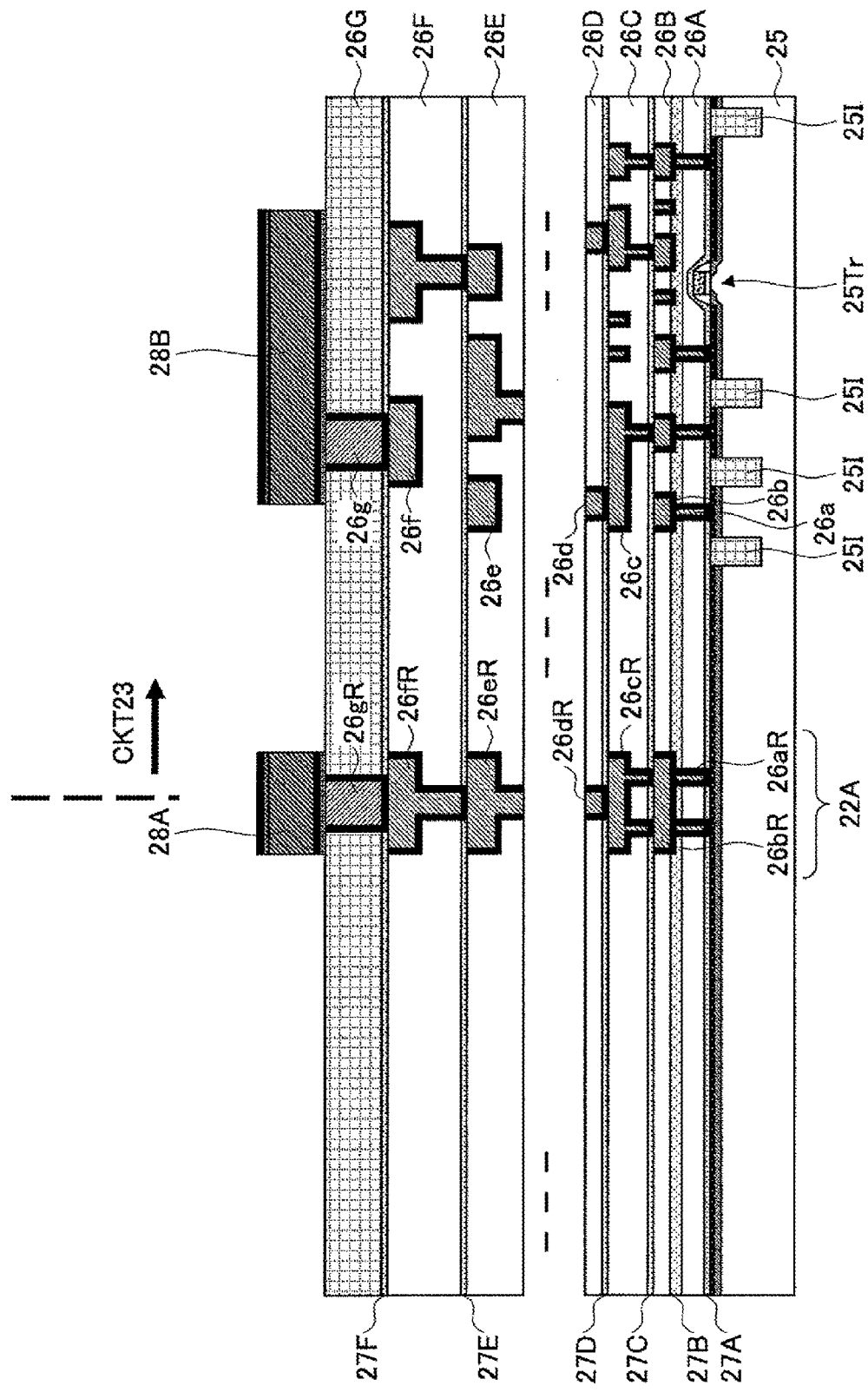

Referring to FIG. 6A, a layered body of the interlayer insulating films 26A through 26G stacked in layers is formed on the silicon substrate 25 where the transistor (active element) 25Tr is formed. A layered structure of the W or Cu patterns 26aR through 26gR is formed in correspondence to the moisture resistant ring 22A in the layered body. The Al pattern 28A is formed on top of the layered body. Further, a layered structure of the W or Cu patterns 26a through 26g is formed in correspondence to a multilayer interconnection structure in the circuit region 23 in the layered body.

In the process of FIG. 6B, the protection groove part 24A is formed outside the moisture resistant ring 22A by dry etching using a gas mixture of a CF-based gas, $O_2$, Ar, etc., as an etching gas, so as to expose the silicon substrate 25. In the process of FIG. 6B, the dry etching is performed with the surface of the layered body except for a region where the protection groove part 24A is to be formed being protected with a resist mask.

Figure 6C:
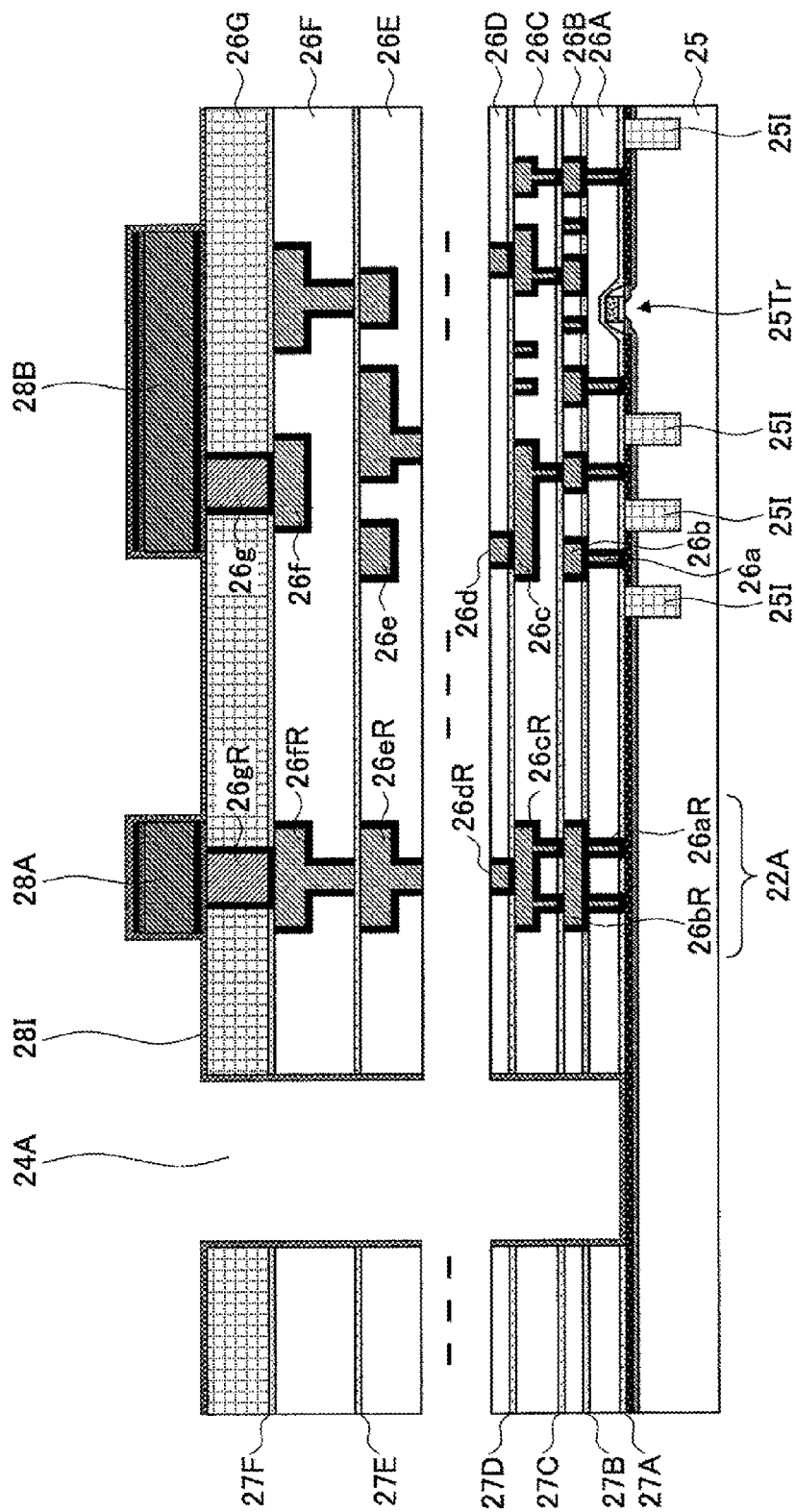

Further, in the process of FIG. 6B, with the formation of the protection groove part 24A, the interlayer insulating films 26A through 26F are exposed to the atmosphere in the protection groove part 24A. As a result, the interlayer insulating films 26A through 26F, even before scribing, absorb moisture outside the moisture resistant ring 22A. In the process of FIG. 6C, however, the structure of FIG. 6B is dehydrated, and the SiC interface film 28I of the above-described thickness is formed on the structure of FIG. 6B by the above-described plasma CVD process. If the interface film 28I is less than or equal to 5 nm in thickness, the interface film 28I fails to produce its effect as an interface film. If the interface film 28I is more than or equal to 200 nm in thickness, this results in an unnecessarily long process time.

Figure 6D:
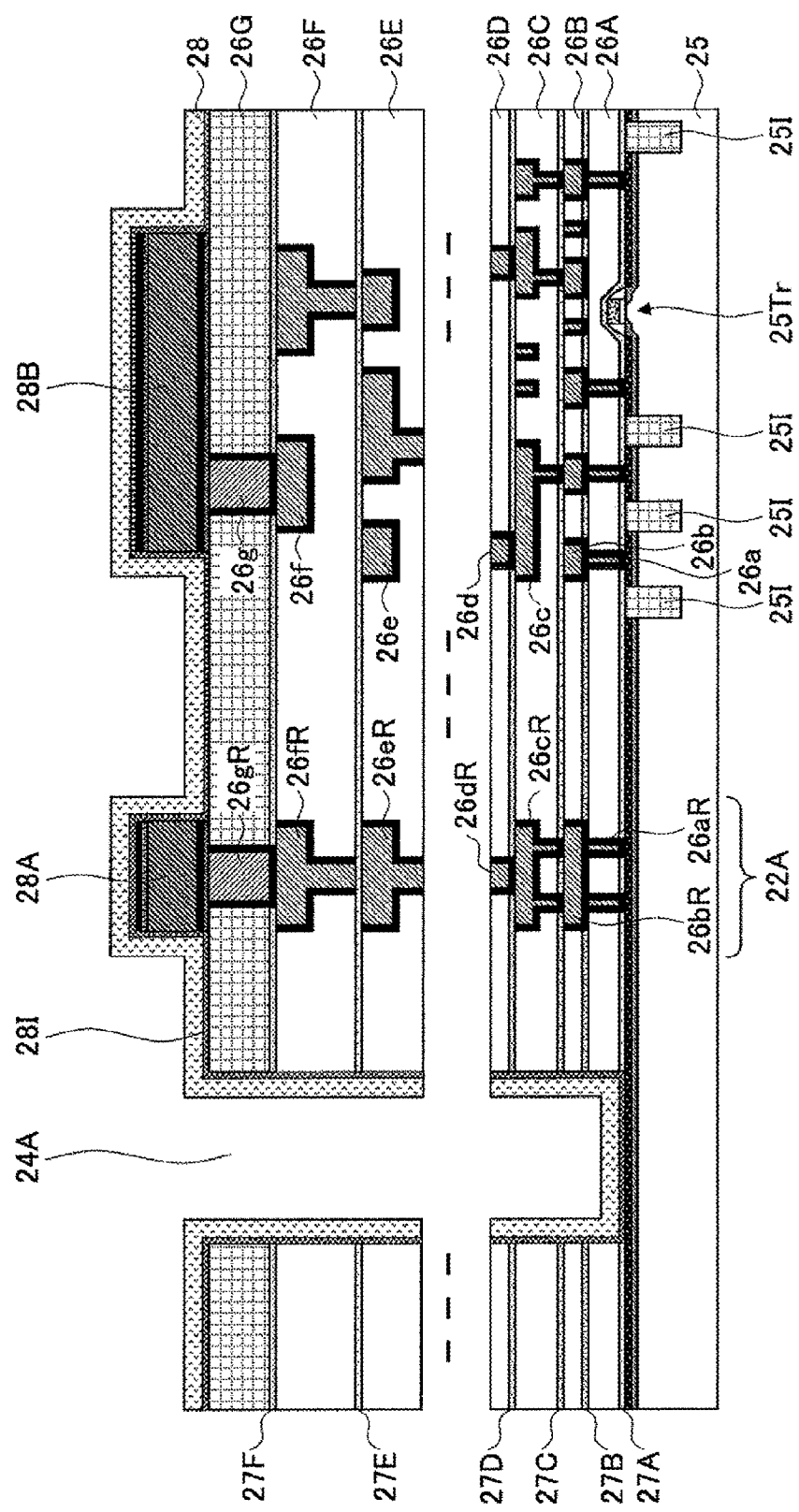
Figure 6E:
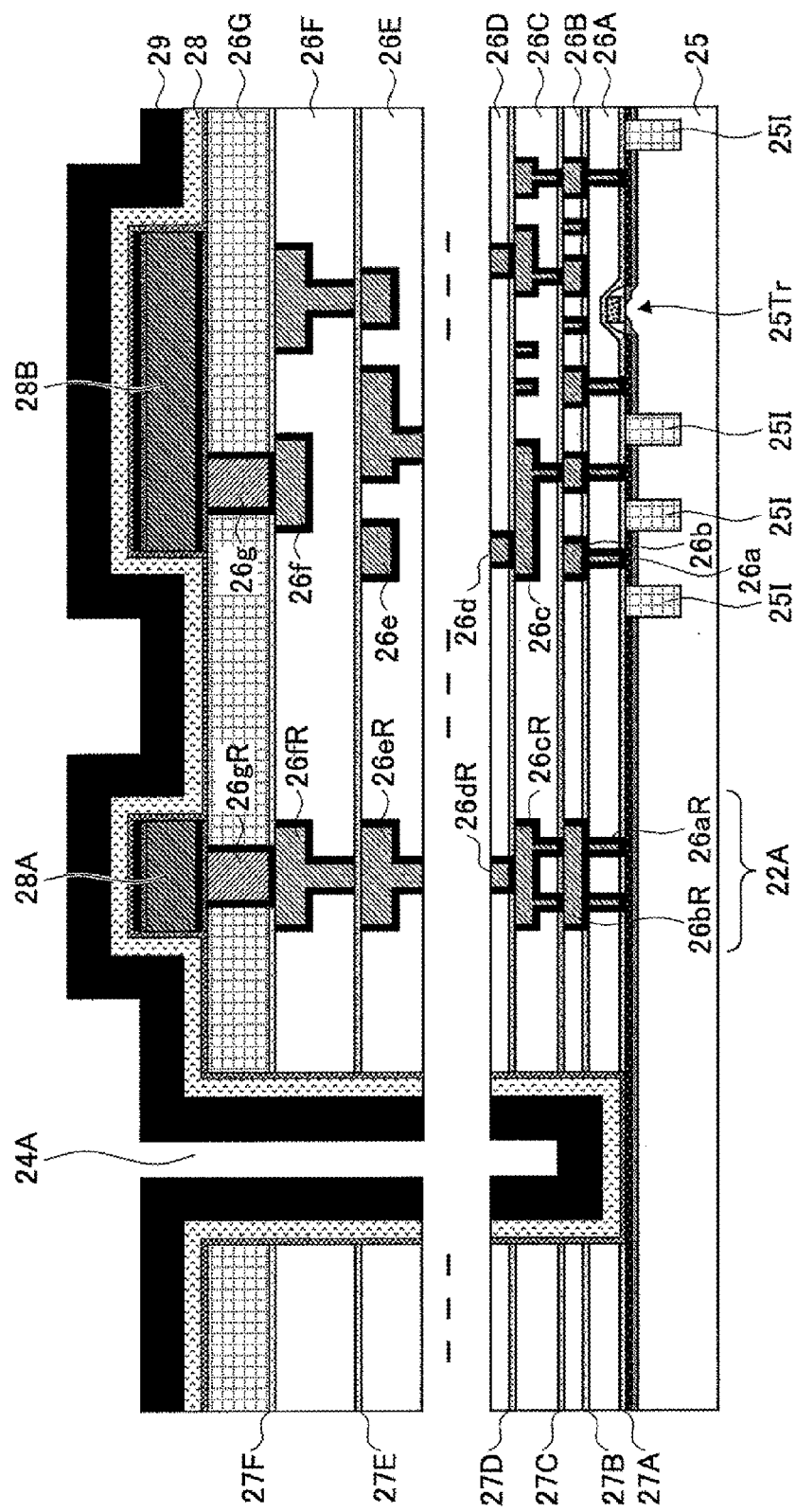

Next, in the process of FIG. 6D, the silicon oxide film 28 of, for example, 1200 nm to 1500 nm in thickness is formed on the structure of FIG. 6C using silane and oxygen as materials at plasma power of approximately 700 W and at a substrate temperature of approximately 400° C. while applying a substrate bias of approximately 4 kW. Further, in the process of FIG. 6E, the SiN passivation film 29 of 500 nm in thickness is formed on the structure of FIG. 6D using silane and ammonia as materials at plasma power of approximately 750 W and at a substrate temperature of approximately 400° C.

Figure 6F:
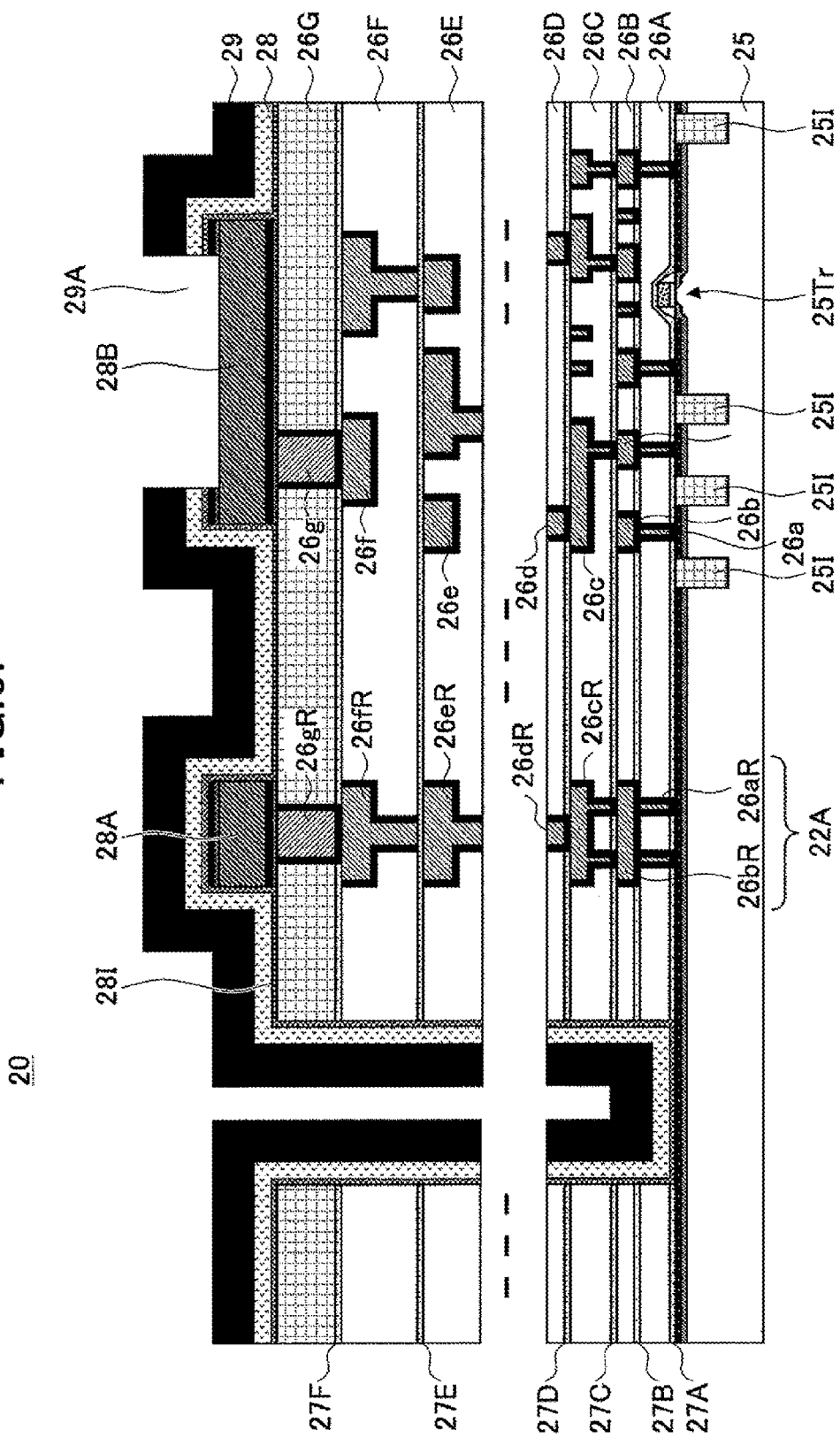

Further, in the process of FIG. 6F, the opening 29A is formed in the SiN passivation film 29, the silicon oxide film 28, and the interface film 28I so as to expose the electrode pad 28B.

Figure 1:
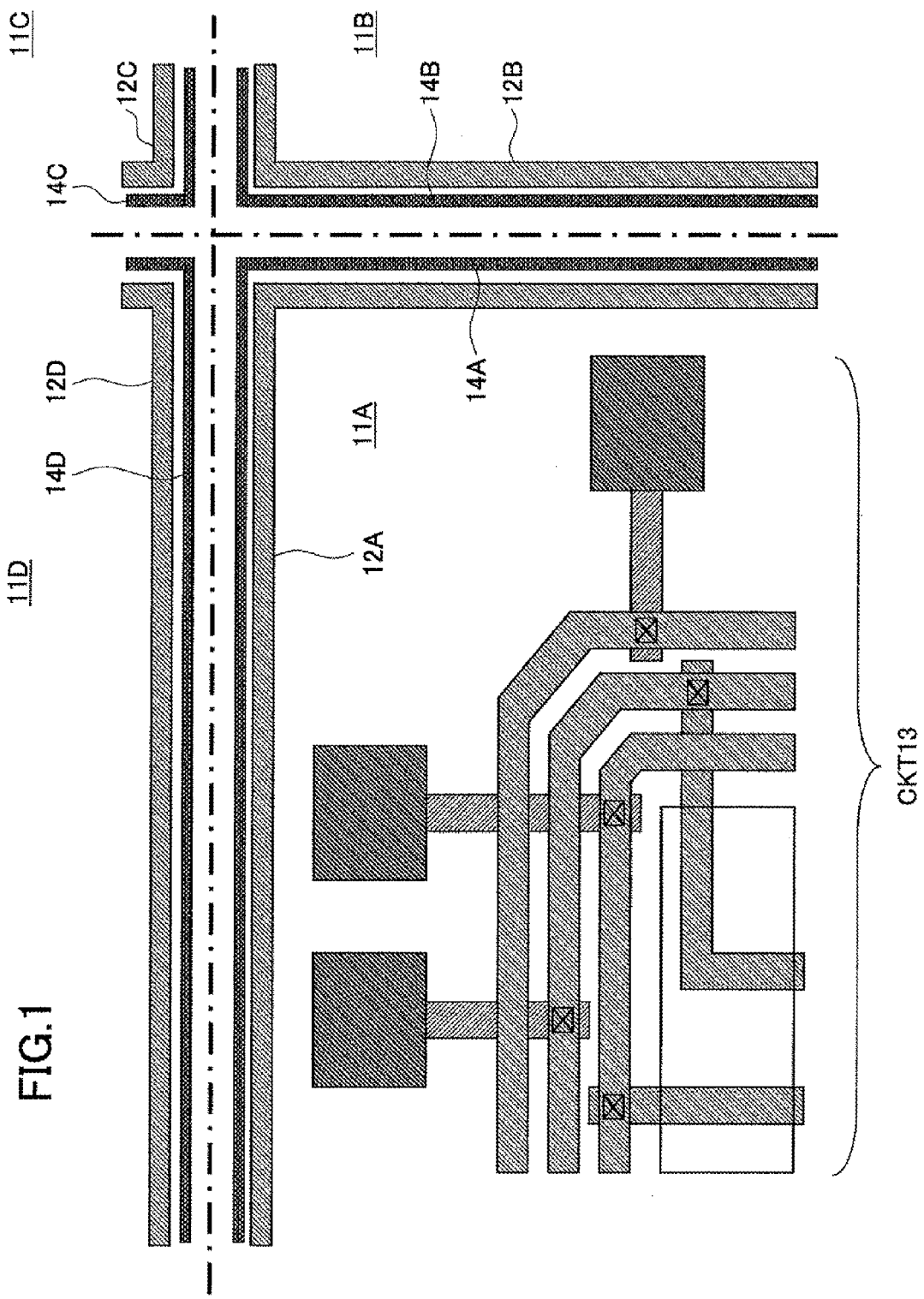
FIG. 1 is a plan view of part of a semiconductor device formed on a semiconductor substrate according to related art.
Figure 2:
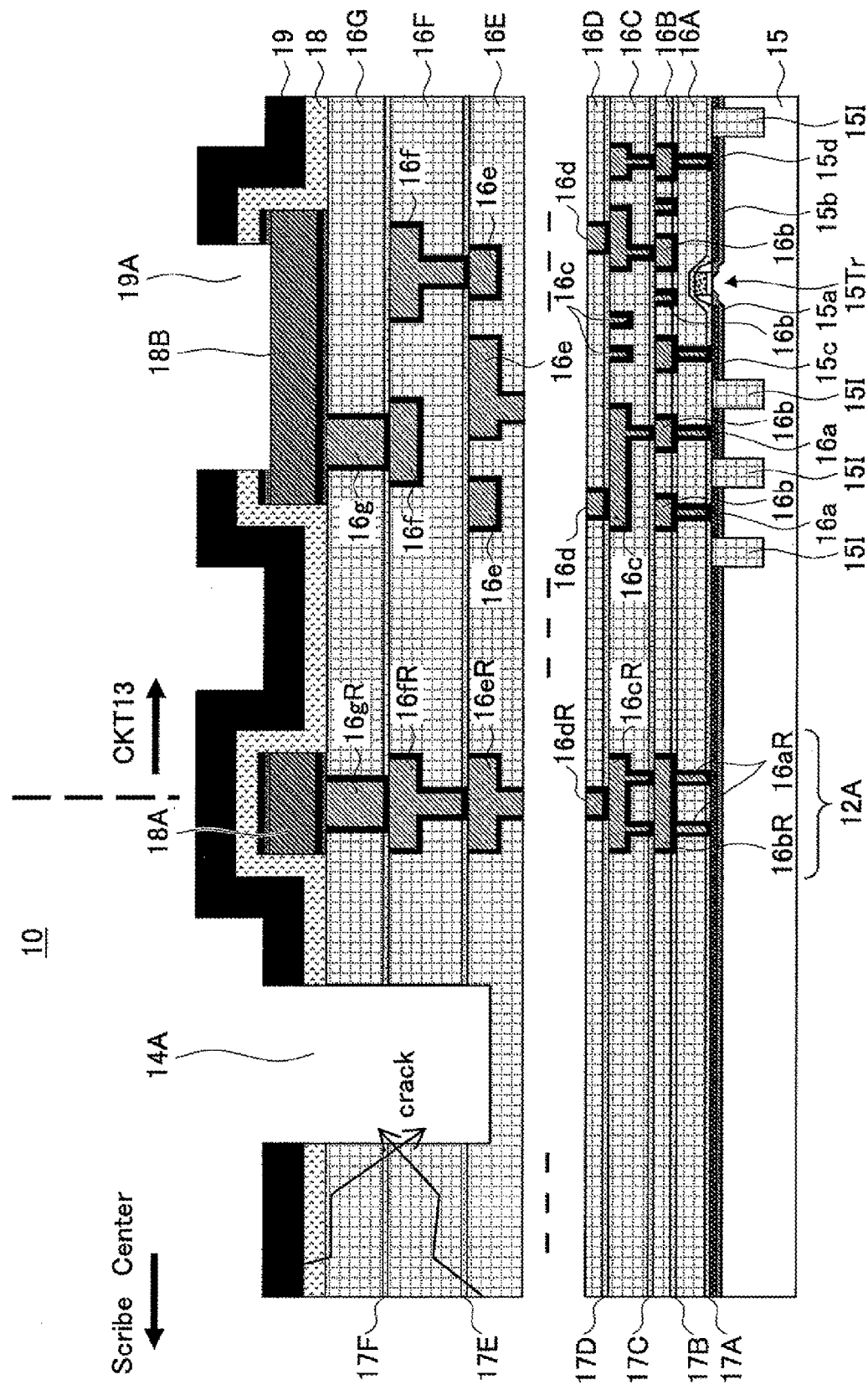
FIG. 2 is a cross-sectional view of part of the semiconductor device according to the related art.
Figure 3:
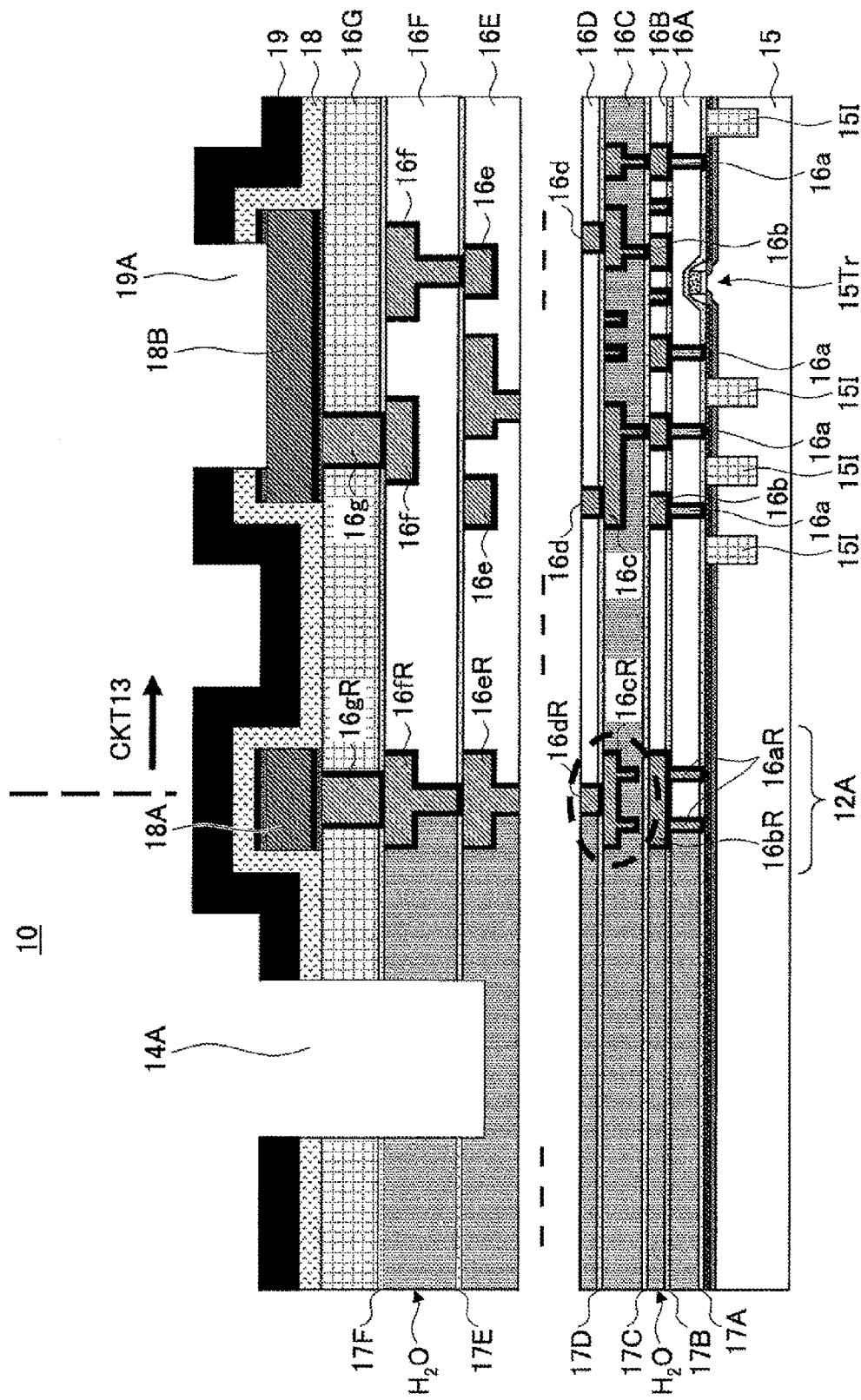
FIG. 3 is a cross-sectional view of the part of the semiconductor device according to the related art.

Further, after the process of FIG. 6F, a silicon wafer (on which the semiconductor device 20 is formed) is scribed along scribing lines as illustrated in FIG. 1, so that the semiconductor device 20 of FIG. 5 is produced.

Figure 7:
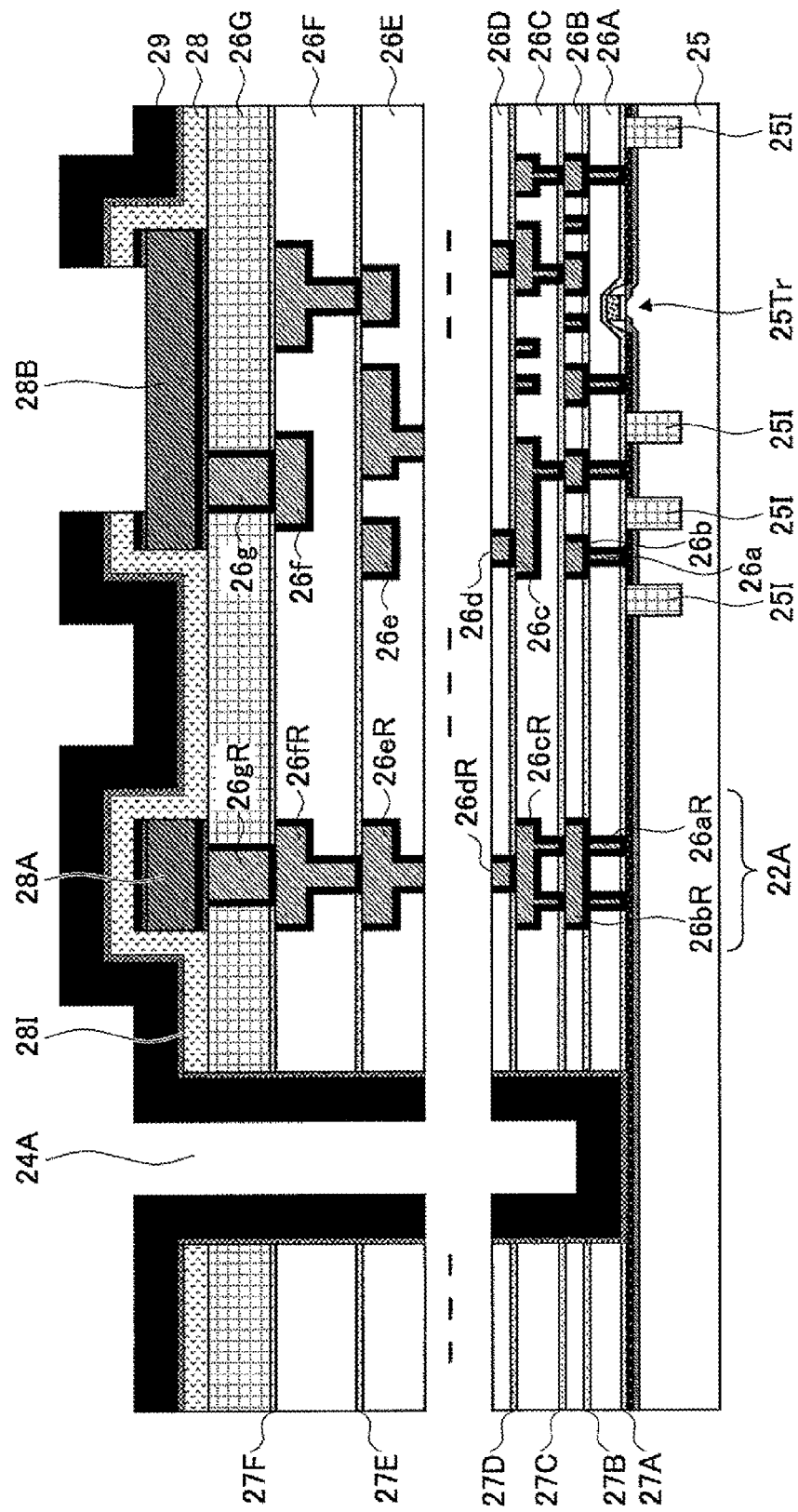
FIG. 7 is a cross-sectional view of a variation of the semiconductor device of FIG. 5 according to the first embodiment.

If the SiN passivation film 29 has sufficient adhesion, the silicon oxide film 28 may be formed before formation of the protection groove part 24A and the SiN passivation film 29 may be formed on and in direct contact with the interface film 28I in the protection groove part 24A as illustrated in FIG. 7 after formation of a groove that reaches the substrate 25 in correspondence to the protection groove part 24A.

[b] Second Embodiment

Figure 8B:
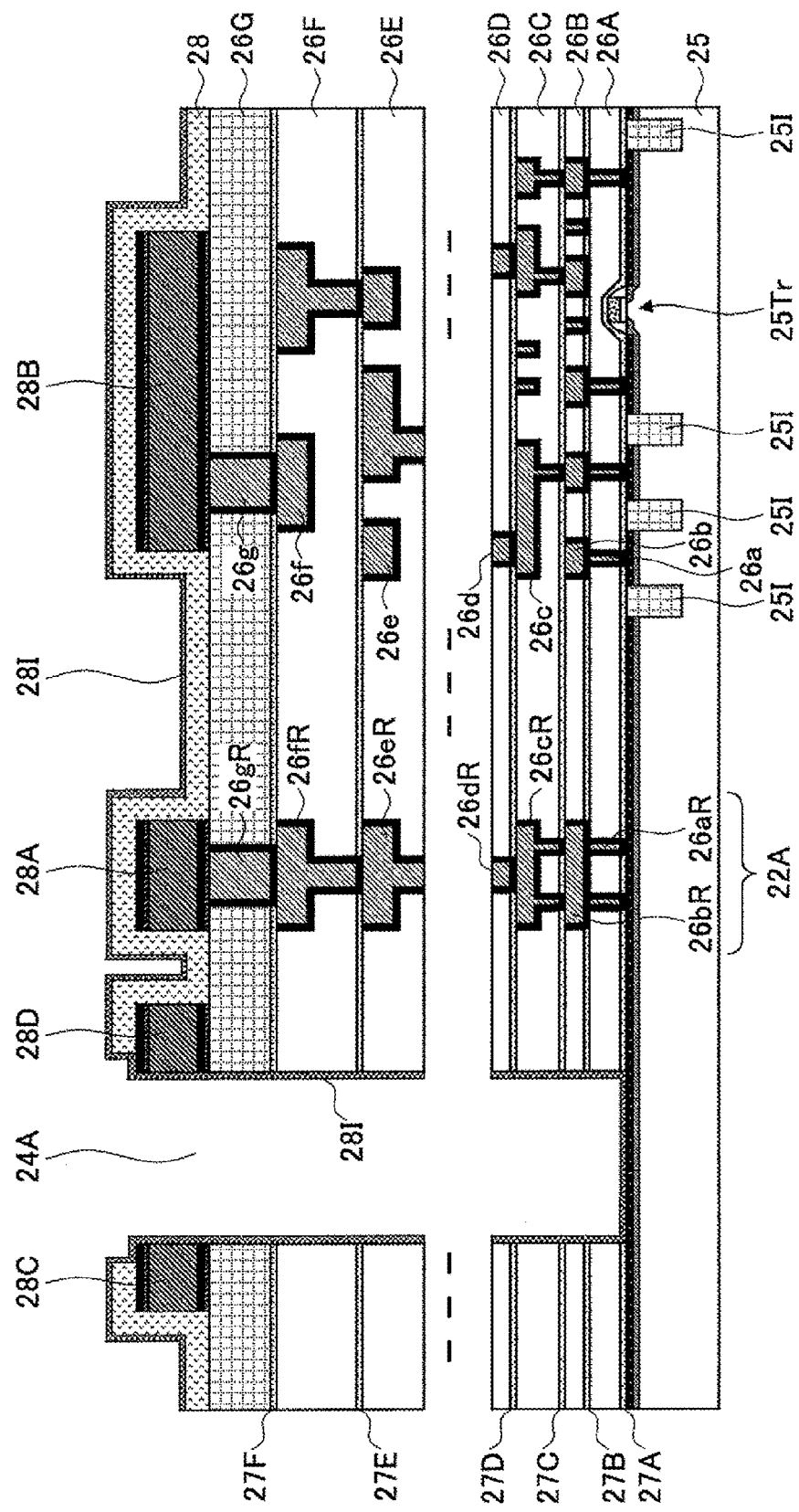
Figure 8C:
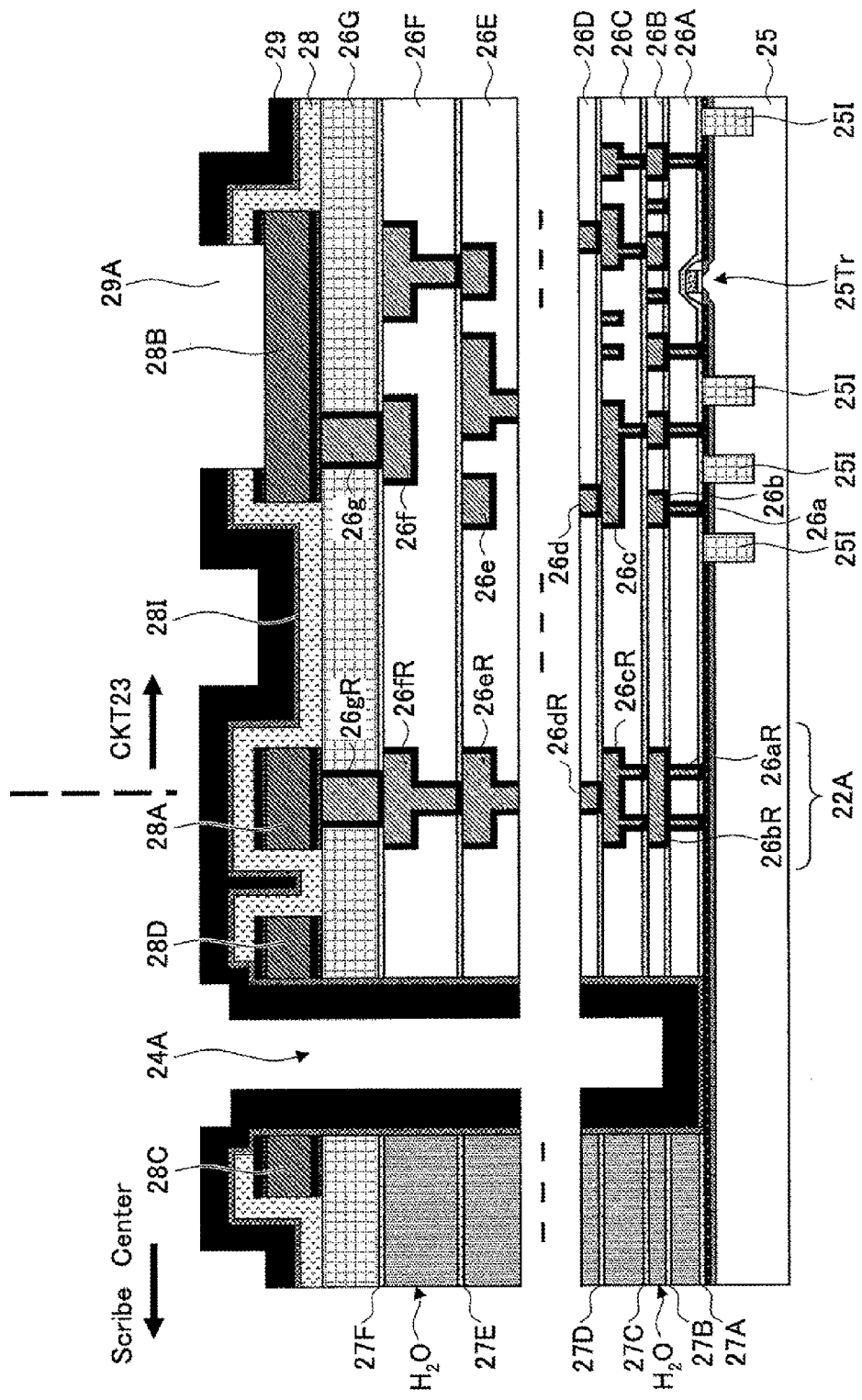

Next, a description is given, with reference to FIGS. 8A through 8C, of a second embodiment of the present invention. In FIGS. 8A through 8C, elements corresponding to those described above are referred to by the same reference numerals, and a description thereof is omitted.

In the first embodiment, a resist process is employed to form the protection groove part 24A by dry etching in the process of FIG. 6B. In the case of forming the protection groove part 24A, dry etching may take such a long time that a resist pattern may not withstand the long dry etching particularly if the semiconductor device has a large number of interlayer insulating films.

This embodiment is directed to such a case where the number of interlayer insulating films in a multilayer interconnection structure is so large that it takes a long time to form the protection groove part 24A.

Referring to FIG. 8A, Al patterns 28C and 28D are formed on the topmost layer of the silicon oxide film 26G in such a manner as to define a region where the protection groove part 24A is to be formed. The Al patterns 28C and 28D are formed simultaneously with the Al pattern 28A and the pad electrode 28B using the same mask. Then, using the Al patterns 28C and 28D as a hard mask, the layered body of the interlayer insulating films 26A through 26G is subjected to dry etching between the Al patterns 28C and 28D, so that the protection groove part 24A is formed.

According to this embodiment, in the next process of FIG. 8B, the structure of FIG. 8A is dehydrated, and the interface film 28I is formed in the same manner as in the process of FIG. 6C. Further, in the process of FIG. 8C, the passivation film 29 is formed on the interface film 28I in the same manner as in the process of FIG. 6E. FIG. 8C illustrates a state where the semiconductor device is further scribed.

According to this configuration, as described above, the protection groove part 24A is formed with stability, so that it is possible to avoid problems such as exposure of the moisture resistant ring 22A due to the sideward advancement of a dry etching process for forming the protection groove part 24A.

In the case described with reference to FIGS. 8A through 8C, the SiN passivation film 29 is in direct contact with the interface film 28I. This embodiment, however, is not limited to this particular case, and is effective also in the case where the same silicon oxide film formed by high-density plasma CVD as the silicon oxide film 28 is interposed between the interface film 28I and the SiN passivation film 29.

Thus, forming the Al patterns 28C and 28D does not increase the number of masks, and thus does not complicate the manufacturing process of the semiconductor device.

Figure 9:
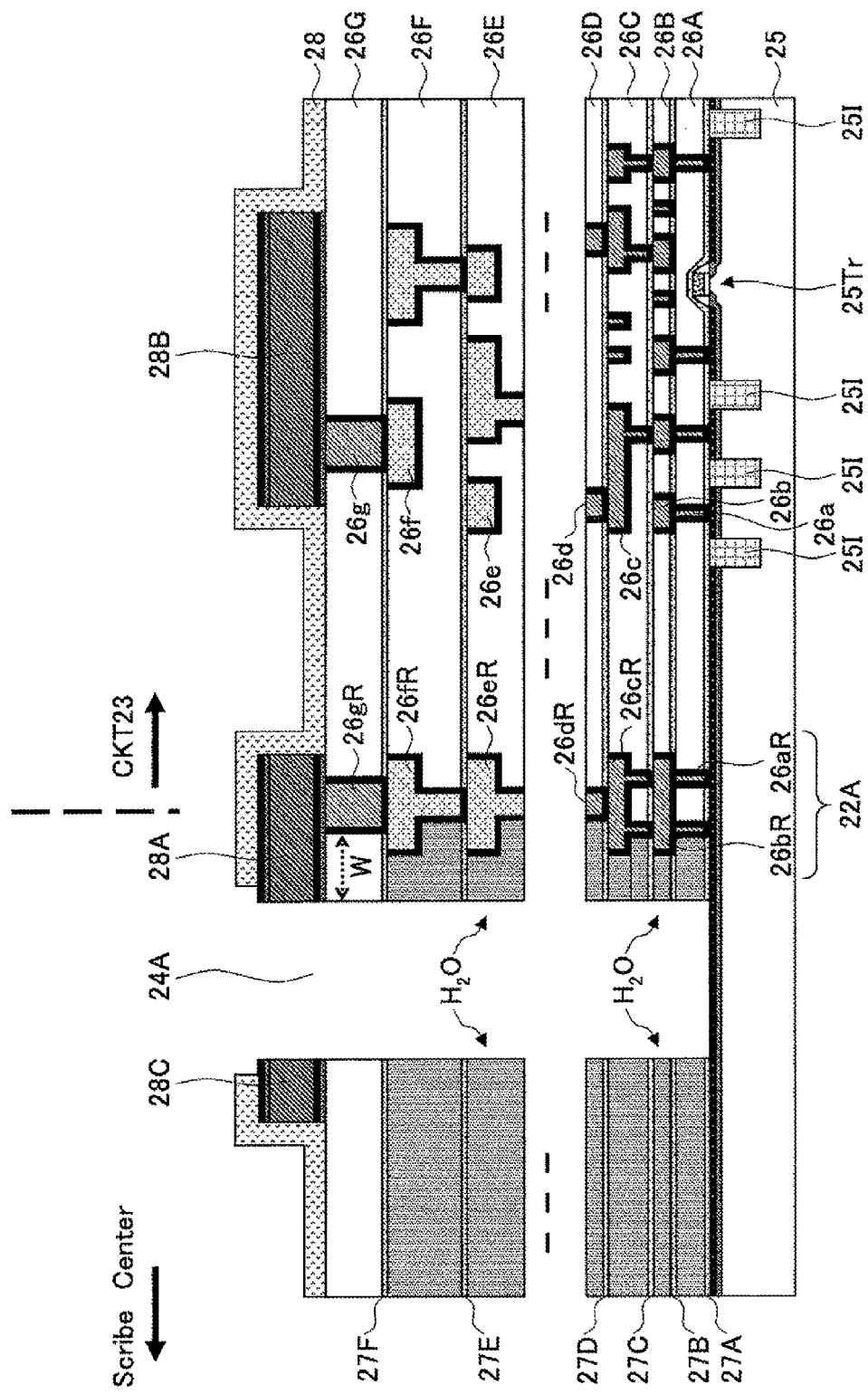
FIG. 9 is a diagram illustrating a variation of the second embodiment.

FIG. 9 illustrates a variation of the process of FIG. 8A.

Referring to FIG. 9, according to this variation, the Al pattern 28A is also used as the Al pattern 28D of FIG. 8A. This makes it possible to reduce chip size as indicated by double-headed arrow W in FIG. 9 compared with the case of FIG. 8A.

Figure 10:
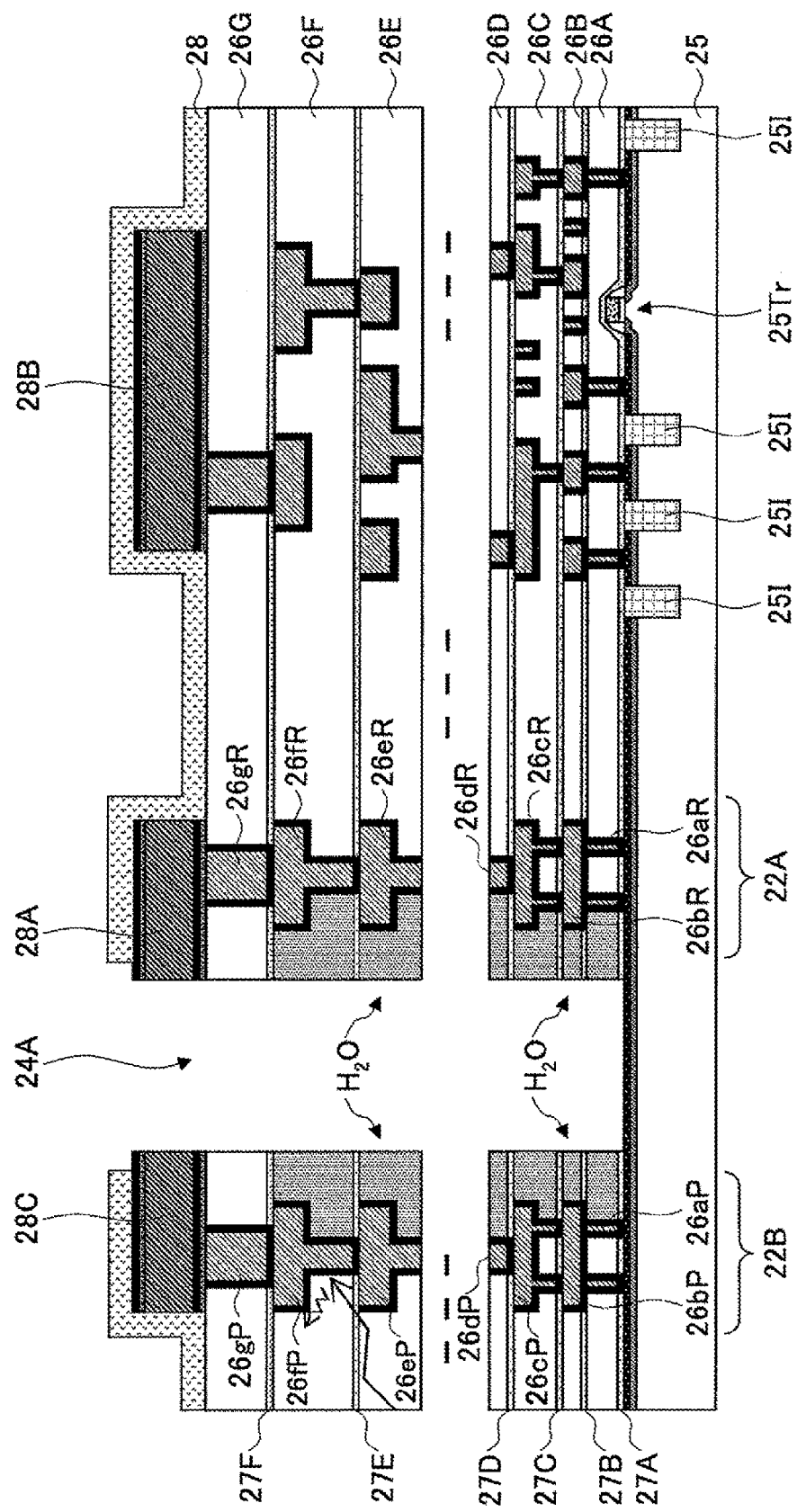
FIG. 10 is a diagram illustrating another variation of the second embodiment.

FIG. 10 illustrates another variation of the process of FIG. 8A.

Referring to FIG. 10, according to this variation, another moisture resistant ring 22B is formed on the outer side of the protection groove part 24A. The moisture resistant ring 22B is the same as the moisture resistant ring 22A, and is formed of Cu or W patterns 26aP, 26bP, 26cP, 26dP, 26eP, 26fP, and 26gP stacked in layers. The Al pattern 28C is formed as the topmost pattern of the moisture resistant ring 22B.

Also according to this configuration, it is possible to control the shape of the protection groove part 24A with accuracy by performing dry etching using the Al patterns 28A and 28C as a mask.

This separate moisture resistant ring 22B may be formed simultaneously with the moisture resistant ring 22A without an increase in the number of processes. Further, the moisture resistant ring 22B is present on the outer side of the protection groove part 24A. This additional moisture resistant ring structure checks the progress of the interface propagation of cracks.

[c] Third Embodiment

Figure 11:
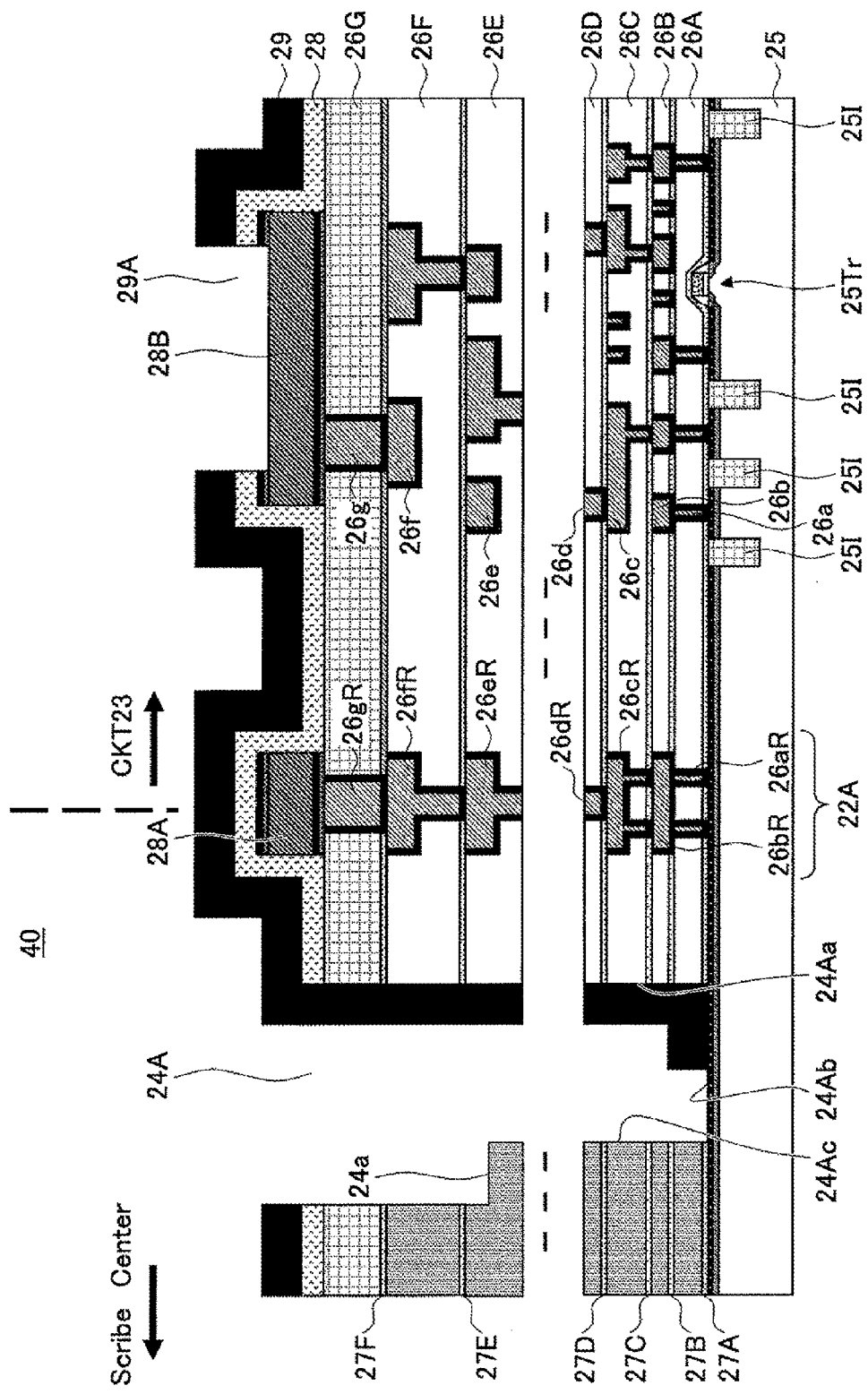
FIG. 11 is a cross-sectional view of a semiconductor device according to a third embodiment.

FIG. 11 illustrates a semiconductor device 40 according to a third embodiment of the present invention. In FIG. 11, elements corresponding to those described above are referred to by the same reference numerals, and a description thereof is omitted.

Referring to FIG. 11, according to this embodiment, the SiN passivation film 29 directly covers the inner-side sidewall surface 24Aa and the bottom surface 24Ab of the protection groove part 24A, but a portion of the SiN passivation film 29 covering the outer-side sidewall surface 24Ac of the protection groove part 24A is removed by performing the same dry etching process as performed to form the protection groove part 24A using a mask pattern formed by slightly offsetting mask data used to form the protection groove part 24A in the scribe line direction. Further, as a result of this dry etching process, a step part 24a is formed on the outer-side sidewall surface 24Ac of the protection groove part 24A in the case of FIG. 11.

This configuration prevents cracks from entering the circuit region 23 inside the moisture resistant ring 22A through the SiN passivation film 29 storing strain at the time of separating the semiconductor device 40 by a scribing process.

Further, according to this embodiment, it is possible to avoid an increase in the number of masks by carrying out the process of removing the SiN passivation film 29 in the protection groove part 24A simultaneously with the process of forming the opening 29A that exposes the pad electrode 28B. In this case, etching substantially stops in the opening 29A when the pad electrode 28B becomes exposed, while further progressing only on the outer-side sidewall surface 24Ac of the protection groove part 24A.

In the case of FIG. 11, the interlayer insulating films 26A through 26F are formed of silicon oxide films, and the SiN passivation film 29 is in direct contact with the interlayer insulating films 26A through 26F in the protection groove part 24A. As described above with reference to FIG. 5 or FIG. 7, if the interlayer insulating films 26A through 26F are low dielectric constant films lower in dielectric constant than $SiO_2$, it is preferable to interpose the silicon oxide film 28 and the interface film 28I or the interface film 28I between the SiN passivation film 29 and the inner-side sidewall surface 24Aa and the bottom surface 24Ab in the protection groove part 24A.

Figure 12:
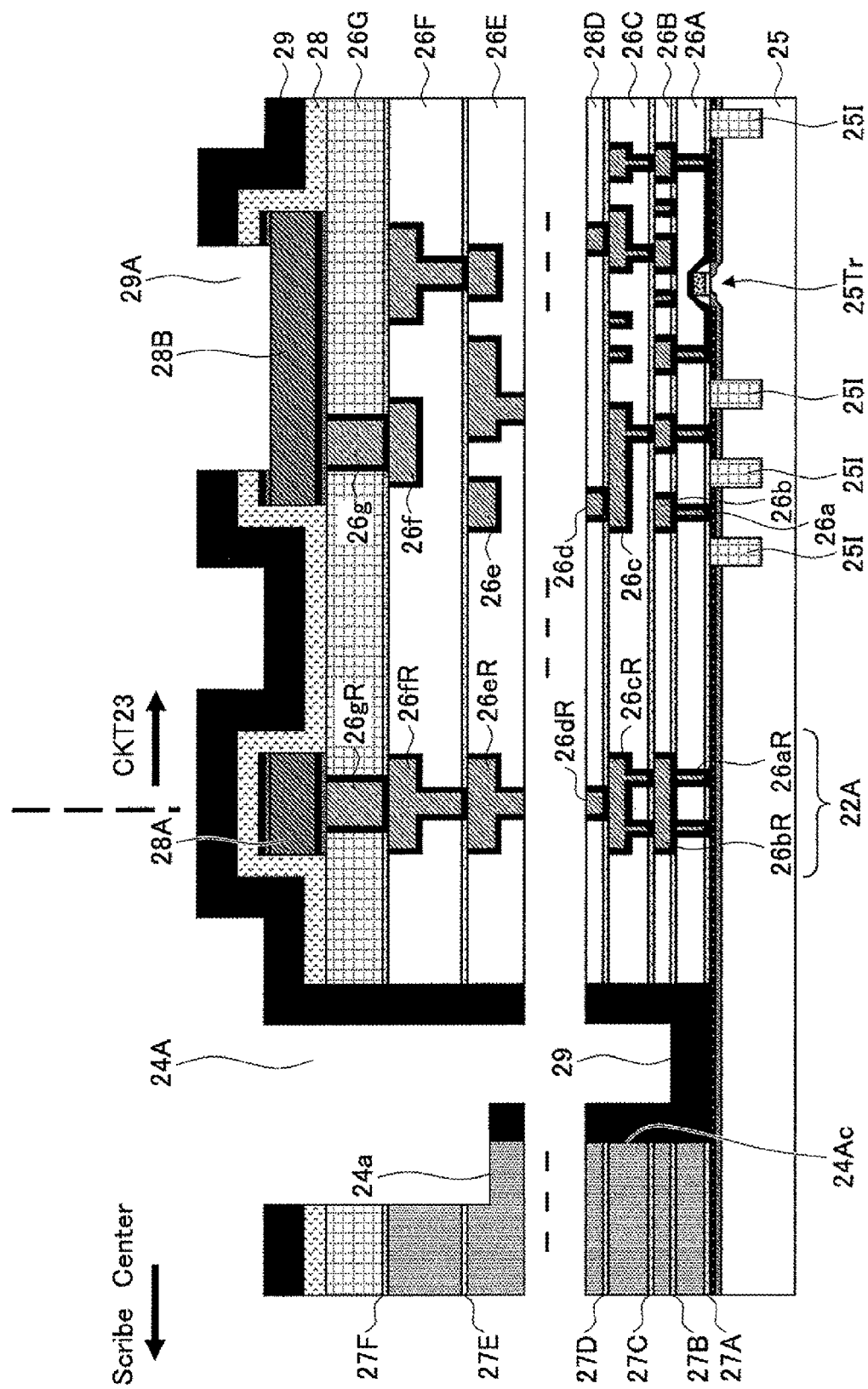
FIG. 12 is a cross-sectional view of a variation of the semiconductor device of FIG. 11 according to the third embodiment.

FIG. 12 illustrates a variation of the configuration of FIG. 11, where the SiN passivation film 29 remains on a portion of the outer-side sidewall surface 24Ac of the protection groove part 24A.

This embodiment may include such a case.

Figure 13:
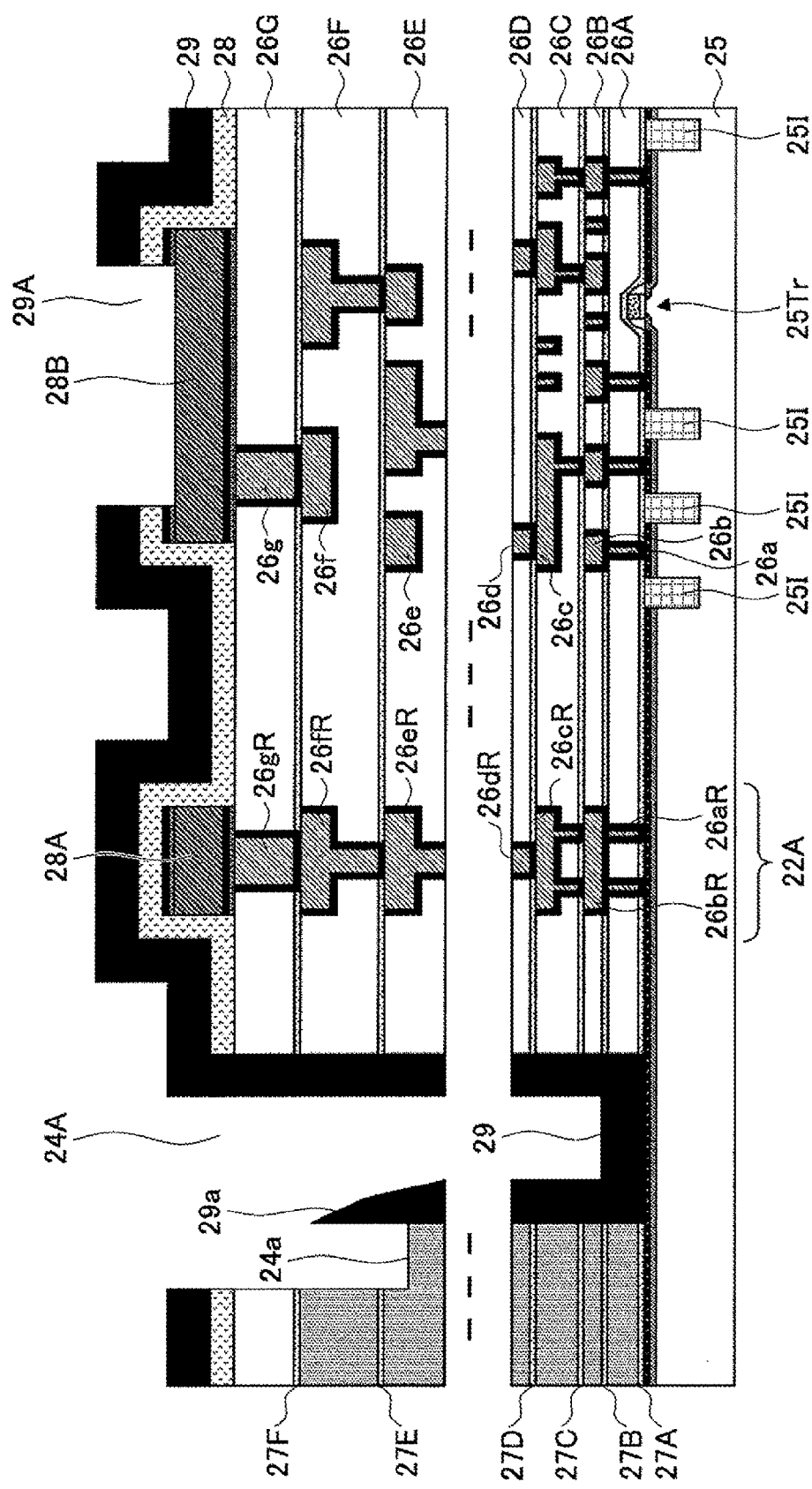
FIG. 13 is a cross-sectional view of another variation of the semiconductor device of FIG. 11 according to the third embodiment.

Further, FIG. 13 illustrates another variation of the configuration of FIG. 11, where a portion of the SiN passivation film 29 left at the time of etching the outer-side sidewall surface 24Ac of the protection groove part 24A forms a projection 29a.

This embodiment may include such a case.

[d] Fourth Embodiment

Figure 14:
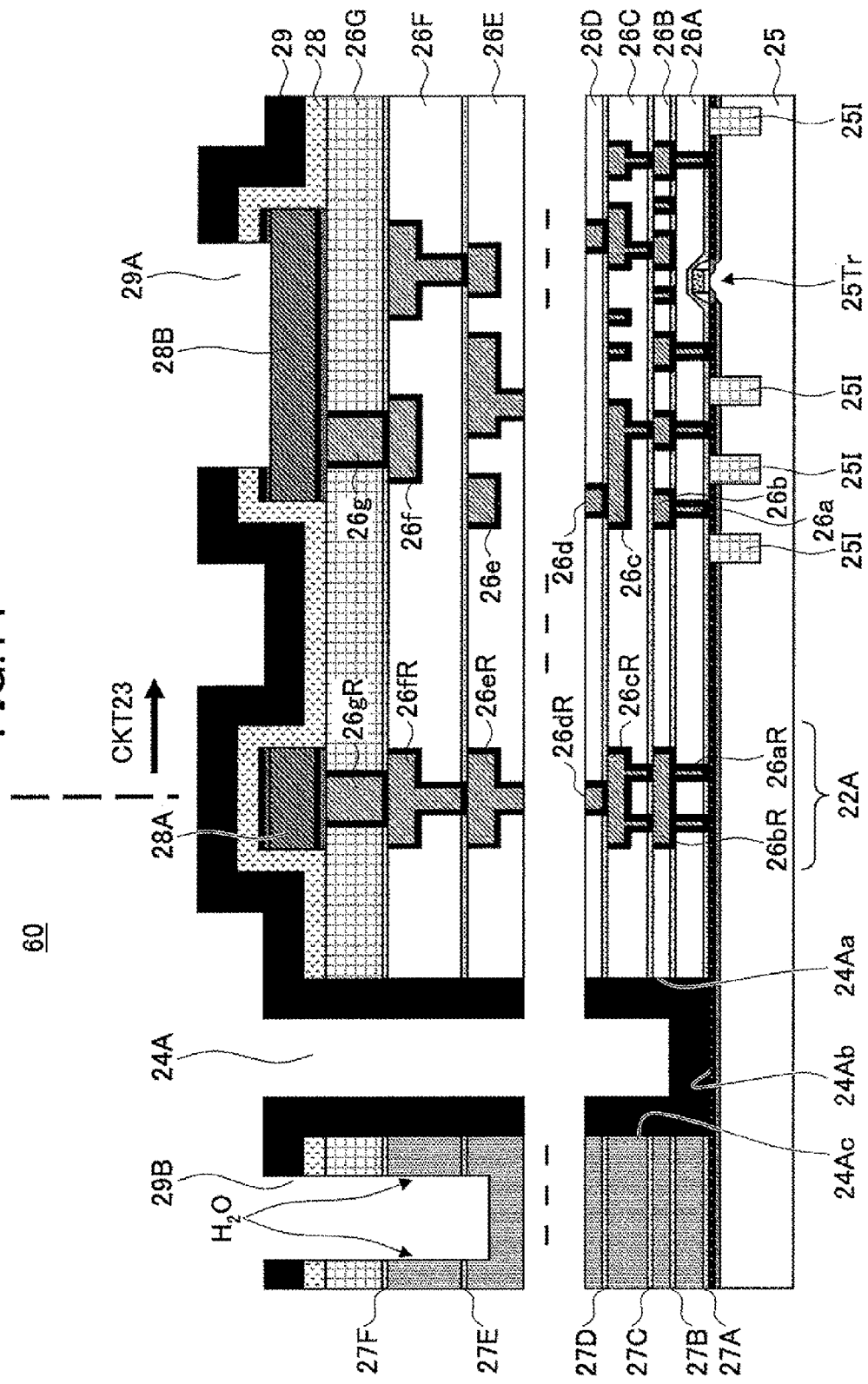
FIG. 14 is a cross-sectional view of a semiconductor device according to a fourth embodiment of the present invention.

FIG. 14 illustrates a semiconductor device 60 according to a fourth embodiment of the present invention. In FIG. 14, elements corresponding to those described above are referred to by the same reference numerals, and a description thereof is omitted.

Referring to FIG. 14, according to this embodiment, the SiN passivation film 29 continuously covers the inner-side sidewall surface 24Aa, the bottom surface 24Ab, and the outer-side sidewall surface 24Ac of the protection groove part 24A, and an opening 29B is continuously formed on the outer side of the protection groove part 24A in the layered body of the interlayer insulating films 26A through 26G so as to surround the protection groove part 24A. The opening 29B is formed simultaneously with the opening 29A.

According to this configuration, even if cracks are generated in the SiN passivation film 29 in the scribing process of the semiconductor device 60, the opening 29B prevents the cracks from propagating to enter the circuit region inside the moisture resistant ring 22A.

It is seen from FIG. 14, which illustrates the pre-scribing state of the semiconductor device 60, that moisture has entered part of the layered body on the outer side of the protection groove part 24A from the opening 29B. This part is also exposed to the atmosphere at the time of scribing to allow entry of moisture. However, the SiN passivation film 29 prevents this moisture from entering the inside of the protection groove part 24A, so that a workload on the moisture resistant ring 22A is significantly reduced.

In the case of FIG. 14, the interlayer insulating films 26A through 26F are formed of silicon oxide films, and the SiN passivation film 29 is in direct contact with the interlayer insulating films 26A through 26F in the protection groove part 24A. As described above with reference to FIG. 5 or FIG. 7, if the interlayer insulating films 26A through 26F are low dielectric constant films lower in dielectric constant than $SiO_2$, it is preferable to interpose the silicon oxide film 28 and the interface film 28I or the interface film 28I between the SiN passivation film 29 and the inner-side sidewall surface 24Aa, the bottom surface 24Ab, and the outer-side sidewall surface 24Ac in the protection groove part 24A.

Figure 15:
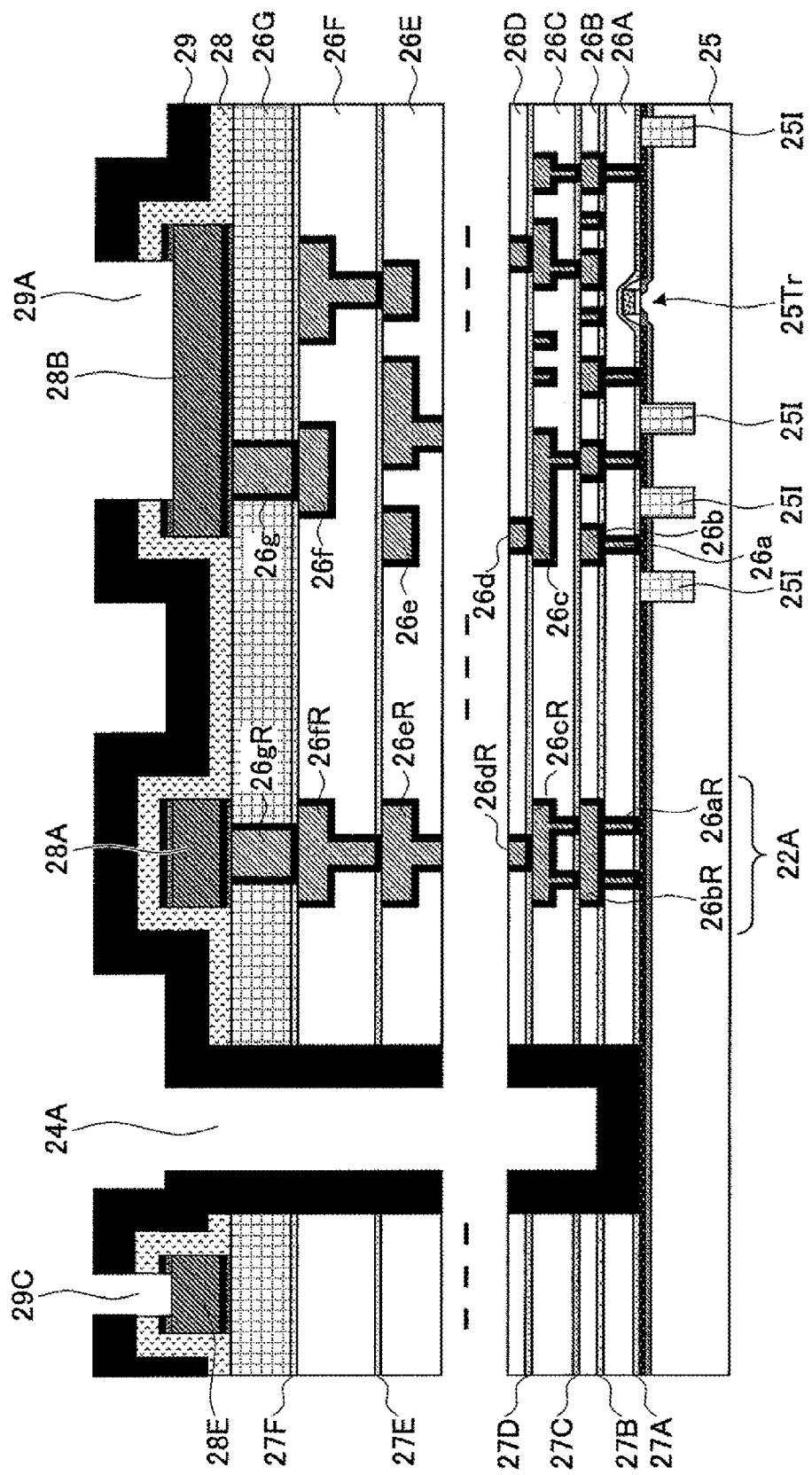
FIG. 15 is a cross-sectional view of a variation of the semiconductor device of FIG. 14 according to the fourth embodiment.

FIG. 15 illustrates a variation of the configuration of FIG. 14, where an Al pattern 28E is formed simultaneously with the Al pattern 28A and the pad electrode 28B on the layered body in correspondence to an opening 29C so as to surround the protection groove part 24A.

According to this variation, the Al pattern 28E is formed at a position corresponding to where the opening 29C is to be formed. Therefore, at the time of forming the opening 29C, dry etching for forming the opening 29C stops at the Al pattern 28E and is prevented from getting deep inside the layered body.

Further, no moisture enters the part of the layered body on the outer side of the protection groove part 24A before scribing.

[e] Fifth Embodiment

FIG. 16 illustrates a semiconductor device 80 according to a fifth embodiment of the present invention. In FIG. 16, elements corresponding to those described above are referred to by the same reference numerals, and a description thereof is omitted.

Referring to FIG. 16, according to this embodiment, the protection groove part 24A formed outside the moisture resistant ring 22A in the layered body formed of the stacked layers of the interlayer insulating films 26A through 26G on the silicon substrate 25 is continuously covered with the SiN passivation film 29, and a resin layer 30 of water soluble resin or the like is formed on the SiN passivation film 29 so as to fill in the protection groove part 24A.

According to this embodiment, the silicon wafer is scribed with the resin layer 30 formed. Accordingly, the energy of cracks is absorbed by the resin layer 30 so as to prevent the cracks from propagating to the circuit region 23.

Application of the resin layer 30 is not limited to the configuration of FIG. 16, and the resin layer 30 may be applied to any of the configurations of the above-described embodiments.

According to an aspect of the present invention, a method of manufacturing a semiconductor device is provided that includes forming a groove in a layered body formed of stacked layers of a plurality of interlayer insulating films lower in dielectric constant than a $SiO_2$ film and including a multilayer interconnection structure, the groove being between a moisture resistant ring and a scribe line and reaching a surface of a semiconductor substrate, the moisture resistant ring surrounding the multilayer interconnection structure in the layered body; forming an interface film including Si and C as principal components and covering sidewall surfaces and a bottom surface of the groove; and forming a protection film on the interface film along the sidewall surfaces and the bottom surface of the groove.

According to an aspect of the present invention, a method of manufacturing a semiconductor device is provided that includes forming a groove in a layered body including a multilayer interconnection structure, the groove being between a moisture resistant ring and a scribe line and reaching a surface of a semiconductor substrate, the moisture resistant ring surrounding the multilayer interconnection structure in the layered body; and forming a protection film covering sidewall surfaces and a bottom surface of the groove using a metal pattern formed on the multilayer interconnection structure as a mask.

According to an aspect of the present invention, a method of manufacturing a semiconductor device is provided that includes forming a groove in a layered body including a multilayer interconnection structure, the groove being between a moisture resistant ring and a scribe line and reaching a surface of a semiconductor substrate, the moisture resistant ring surrounding the multilayer interconnection structure in the layered body; forming a protection film covering a first sidewall surface, a bottom surface, and a second sidewall surface of the groove, the first sidewall surface being closer to the moisture resistant ring than the second sidewall surface is, the second sidewall surface being closer to the scribe line than the first sidewall surface is; and at least partially removing a part of the protection film covering the second sidewall surface of the groove.

According to an aspect of the present invention, a method of manufacturing a semiconductor device is provided that includes forming a groove in a layered body including a multilayer interconnection structure, the groove being between a moisture resistant ring in the multilayer structure and a scribe line and reaching a surface of a semiconductor substrate; forming a protection film covering sidewall surfaces and a bottom surface of the groove; and removing the protection film on an upper surface of the layered body on an outer side of the groove.

According to an aspect of the present invention, a protection groove part so deep as to reach the surface of a substrate is formed outside a moisture resistant ring in a semiconductor device having a layered body forming a multilayer interconnection structure on the substrate. This protects part of the semiconductor device inside the moisture resistant ring from cracks at the time of dicing. In this configuration, covering at least the inner-side sidewall surface of the protection groove part with a protection film prevents entry of moisture into the semiconductor device through the inner-side sidewall surface of the protection groove part.

According to an aspect of the present invention, even if the multilayer interconnection structure is formed of low dielectric constant interlayer insulating films stacked in layers, covering the (inner-side and outer-side) sidewall surfaces of the protection groove part with an interface film including Si and C as principal components avoids the problem of erosion of the end faces of the interlayer insulating films exposed at the sidewall surfaces of the protection groove part at the time of forming the protection film.

According to an aspect of the present invention, a desired protection groove part is stably formed in the layered body using a metal pattern formed on the surface of the layered body as a hard mask even if the protection groove part is so deep as to reach the surface of the substrate.

According to an aspect of the present invention, removing the protection film on the outer-side sidewall surface of the protection groove part and/or on the outer side of the protection groove part prevents entry of cracks into the semiconductor device through the protection film storing strain at the time of separating the semiconductor device by a scribing process, thus improving the manufacturing yield of semiconductor devices.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method of manufacturing a semiconductor device, comprising:
    forming a first insulating film above a semiconductor substrate that includes a circuit region and a scribe region;
    forming a first via pattern, that continuously surrounds the circuit region, in the first insulating film;
    forming a first conductive material in the first via pattern;
    forming a second insulating film above the first via pattern and the first insulating film;
    forming a first interconnection pattern in the second insulating film;
    forming a second conductive material, that continuously contacts the first conductive material, in the first interconnection pattern;
    forming a third insulating film above the first interconnection pattern and the second insulating film;
    forming a second interconnection pattern in the third insulating film;
    forming a third conductive material, that continuously contacts the second conductive material, in the second interconnection pattern;
    forming an Al pattern in a first region and above the third insulating film and the second interconnection pattern, the Al pattern being not formed in a region different from the first region;
    after forming the Al pattern, forming a groove in the first insulating film, the second insulating film and the third insulating film in a region between the first via pattern and the scribe region in the region different from the first region, the groove reaching the semiconductor substrate;
    covering a sidewall of the groove, a bottom of the groove and the third insulating film with a fourth insulating film, the fourth insulating film including Si and C as principal components; and
    forming a fifth insulating film over the fourth insulating film.

2. The method of manufacturing a semiconductor device according to claim 1, wherein the first via pattern is a groove-shaped via pattern.

3. The method of manufacturing a semiconductor device according to claim 1, wherein the first interconnection pattern is formed by a single damascene process in correspondence to the first via pattern.

4. The method of manufacturing a semiconductor device according to claim 1,
    wherein the second interconnection pattern is formed by a dual damascene process in correspondence to the first interconnection pattern.

5. The method of manufacturing a semiconductor device according to claim 1,
    wherein the first conductive material is same as the second conductive material.

6. The method of manufacturing a semiconductor device according to claim 1,
    wherein the second conductive material is same as the third conductive material.

7. The method of manufacturing a semiconductor device according to claim 1, wherein the first insulating film, the second insulating film and the third insulating film are lower in dielectric constant than a silicon oxide film.

8. The method of manufacturing a semiconductor device according to claim 1, wherein the fourth insulating film is formed directly on the semiconductor substrate in the groove.

9. The method of manufacturing a semiconductor device according to claim 1, wherein whole of the groove is located between the first via pattern and the scribe region.

10. The method of manufacturing a semiconductor device according to claim 1, further comprising:
    forming a sixth insulating film on the fifth insulating film.

11. The method of manufacturing a semiconductor device according to claim 1, wherein a thickness of the fourth insulating film is from 5 nm to 200 nm.

12. The method of manufacturing a semiconductor device according to claim 1, wherein the groove is formed using the Al pattern as an etching mask.

13. The method of manufacturing a semiconductor device according to claim 1, wherein:
    in forming the first via pattern, a second via pattern is formed in the first insulating film,
    the second via pattern continuously surrounds the groove,
    in forming the first conductive material, a fourth conductive material is formed in the second via pattern,
    the fourth conductive material includes a material same as the first conductive material,
    in forming the first interconnection pattern, a third interconnection pattern is formed in the second insulating film,
    in forming the second conductive material, a fifth conductive material is formed in the third interconnection pattern,
    the fifth conductive material includes a material same as the second conductive material,
    the fifth conductive material continuously contacts the fourth conductive material, in forming the second interconnection pattern, a fourth interconnection pattern is formed in the third insulating film, in forming the third conductive material, a sixth conductive material is formed in the third interconnection pattern, the sixth conductive material continuously contacts the fifth conductive material, and the sixth conductive material includes a material same as the third conductive material.

14. The method of manufacturing a semiconductor device according to claim 13, wherein the second via pattern is a groove-shaped via pattern.

15. The method of manufacturing a semiconductor device according to claim 13, wherein the third interconnection pattern is formed by a single damascene process in correspondence to the second via pattern.

16. The method of manufacturing a semiconductor device according to claim 13, wherein the fourth interconnection pattern is formed by a dual damascene process in correspondence to the third interconnection pattern.

* * * * *